US012615886B2

(12) United States Patent
Min et al.

(10) Patent No.: US 12,615,886 B2
(45) Date of Patent: Apr. 28, 2026

(54) LIGHT EMITTING DIODE HAVING MULTIPLE ACTIVE LAYERS AND LIGHT EMITTING DEVICE HAVING THE SAME

(71) Applicant: SEOUL VIOSYS CO., LTD., Gyeonggi-do (KR)

(72) Inventors: Dae Hong Min, Gyeonggi-do (KR); Yong Hyun Baek, Gyeonggi-do (KR); Ji Hun Kang, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 631 days.

(21) Appl. No.: 18/077,273

(22) Filed: Dec. 8, 2022

(65) Prior Publication Data

US 2023/0098895 A1 Mar. 30, 2023

Related U.S. Application Data

(63) Continuation-in-part of application No. 17/892,189, filed on Aug. 22, 2022.
(Continued)

(51) Int. Cl.
H10H 20/825 (2025.01)
H10H 20/814 (2025.01)
(Continued)

(52) U.S. Cl.
CPC ........ H10H 20/825 (2025.01); H10H 20/814 (2025.01); H10H 20/821 (2025.01); H10H 20/857 (2025.01)

(58) Field of Classification Search
CPC ............. H10H 20/8131; H10H 20/813; H10H 20/819; H10H 20/821; H10H 20/80–812
See application file for complete search history.

(56) References Cited

U.S. PATENT DOCUMENTS

| 2008/0315179 A1 | 12/2008 | Kim et al. |
| 2009/0173961 A1 | 7/2009 | Windisch et al. |
| | (Continued) | |

FOREIGN PATENT DOCUMENTS

| CN | 105870286 A | 8/2016 |
| KR | 20080085057 A | 9/2008 |
| | (Continued) | |

OTHER PUBLICATIONS

International Search Report for International Application No. PCT/KR2022/012568, mailed Dec. 19, 2022, English translation, 3 pages.

(Continued)

*Primary Examiner* — Steven B Gauthier
*Assistant Examiner* — Candice Chan
(74) *Attorney, Agent, or Firm* — LaBatt, LLC

(57) ABSTRACT

A light emitting diode according to an exemplary embodiment of the present disclosure includes: a first conductivity type nitride semiconductor layer; a V-pit generation layer disposed on the n-type nitride semiconductor layer and having a V-pit; a lower active layer disposed on the V-pit generation layer; an upper active layer disposed on the lower active layer; an intermediate layer disposed between the lower active layer and the upper active layer; a second conductivity type nitride semiconductor layer disposed on the upper active layer, an upper step coverage layer disposed between the second conductivity type semiconductor layer and the upper active layer; and a lower step coverage layer disposed between the intermediate layer and the lower active layer, in which in an electroluminescence spectrum, the light emitting diode emits light having a highest peak intensity in a wavelength range of 500 nm or more in a visible light region.

19 Claims, 26 Drawing Sheets

300

Related U.S. Application Data

(60) Provisional application No. 63/288,069, filed on Dec. 10, 2021, provisional application No. 63/240,121, filed on Sep. 2, 2021, provisional application No. 63/236,400, filed on Aug. 24, 2021.

(51) Int. Cl.
H10H 20/821 (2025.01)
H10H 20/857 (2025.01)

(56) References Cited

U.S. PATENT DOCUMENTS

| | | | |
|---|---|---|---|
| 2010/0219437 | A1 | 9/2010 | Usuda et al. |
| 2013/0082273 | A1 | 4/2013 | Ting |
| 2016/0141455 | A1 | 5/2016 | Lim et al. |
| 2018/0219125 | A1* | 8/2018 | Wicke .................. H10H 20/857 |
| 2018/0261724 | A1 | 9/2018 | Park et al. |
| 2018/0351039 | A1 | 12/2018 | Kim |
| 2019/0348567 | A1* | 11/2019 | Na ..................... H10H 20/8215 |
| 2020/0403121 | A1 | 12/2020 | Danesh et al. |
| 2021/0242371 | A1 | 8/2021 | Baek et al. |
| 2021/0328100 | A1 | 10/2021 | Baek et al. |
| 2022/0216188 | A1* | 7/2022 | Baek .................. H10H 20/8506 |

FOREIGN PATENT DOCUMENTS

| | | | |
|---|---|---|---|
| KR | 1020090002214 | A | 1/2009 |
| KR | 20150078641 | A | 7/2015 |
| KR | 20160058321 | A | 5/2016 |
| KR | 20180103268 | A | 9/2018 |
| WO | 2016197062 | A1 | 12/2016 |
| WO | 2018128419 | A1 | 7/2018 |
| WO | 2021158016 | A1 | 8/2021 |
| WO | 2021210919 | A1 | 10/2021 |

OTHER PUBLICATIONS

International Search Report for International Application No. PCT/KR2022/020032, mailed Mar. 28, 2023, English Translation, 3 pages.

Office action for U.S. Appl. No. 17/892,189, filed Jun. 24, 2025, 14 pages.

Extended European Search Report for European Patent Application No. 22861683.5, Oct. 15, 2025, 9 pages.

Extended European Search Report for European Patent Application No. 22904715.4, Oct. 21, 2025, 10 pages.

Final office action for U.S. Appl. No. 17/892,189, Jan. 9, 2026, 12 pages.

Examination Report for corresponding Indian Patent Application No. 202417039425, Feb. 25, 2026, 8 pages.

* cited by examiner

Wavelength(nm)    −ΔWp    +ΔWp

Wavelength(nm)

<u>2000</u>

LIGHT EMITTING DIODE HAVING MULTIPLE ACTIVE LAYERS AND LIGHT EMITTING DEVICE HAVING THE SAME

CROSS-REFERENCE OF RELATED APPLICATION AND PRIORITY

The present application is a continuation-in-part application of the non-provisional application Serial No. U.S. Ser. No. 17/892,189, filed Aug. 22, 2022, which claims priority to and the benefit of U.S. Provisional Application No. 63/236,400, filed Aug. 24, 2021, and priority to and the benefit of U.S. Provisional Application No. 63/240,121, filed Sep. 2, 2021, and further claims priority to and the benefit of U.S. Provisional Application Ser. No. 63/288,069, filed Dec. 10, 2021, the disclosures of which are incorporated by reference as if they are fully set forth herein.

TECHNICAL FIELD

Exemplary embodiments relate to a light emitting diode, and more particularly, to a light emitting diode emitting light having multi-bands at a single chip level.

BACKGROUND ART

A nitride semiconductor is used as a light source of a display apparatus, traffic light, lighting, or an optical communication device, and is mainly used in a light emitting diode or a laser diode that emits blue or green light. In addition, the nitride semiconductor may be used in a heterojunction bipolar transistor (HBT), a high electron mobility transistor (HEMT), and the like.

In general, a light emitting diode using the nitride semiconductor has a heterojunction structure having a quantum well structure between an N contact layer and a P contact layer. The light emitting diode emits light according to a composition of a well layer in the quantum well structure. In order to increase an internal quantum efficiency and reduce the loss due to light absorption, the light emitting diode is designed to emit light of a spectrum having a single peak, that is, monochromatic light.

Mixed color light, such as white light, emitted from lighting or the like cannot be implemented as single-peak monochromatic light. Accordingly, a technique of implementing white light by using a plurality of light emitting diodes together emitting different monochromatic light from one another or by using a phosphor converting a wavelength of light emitted from the light emitting diode is generally used.

The use of phosphors comes with cost of phosphor or a decrease in efficiency known as a Stoke's shift. In addition, a process of coating phosphor on the light emitting diode and yellowing of a carrier carrying phosphor should also be considered.

Using a mixture of a plurality of light emitting diodes also complicates the process, and it is inconvenient to prepare light emitting diodes made of different materials.

If light having a spectrum of multi-bands can be implemented using a single-chip light emitting diode, there is no need to manufacture the light emitting diodes using different materials, and an amount of phosphor used may be reduced or the use of phosphor may be avoided.

Meanwhile, in a light emitting diode implementing light having a spectrum of multi-bands, a color coordinate is determined by a mixed-color light emitted from the light emitting diode. The color coordinate may be determined by the bands of light generated in the light emitting diode and relative intensities between the bands.

SUMMARY

Exemplary embodiments provide a light emitting diode that emits light having a spectrum of multi-bands at a single chip level, and a light emitting device having the same.

Exemplary embodiments provide a novel technique to adjust relative intensities between bands of a spectrum of multi-bands.

Exemplary embodiments provide a light emitting diode and a light emitting device to easily implement mixed-color light having a desired color coordinate.

Exemplary embodiments provide a light emitting diode and a light emitting device to emit visible light of a longer wavelength.

A light emitting diode according to an exemplary embodiment of the present disclosure includes: a first conductivity type nitride semiconductor layer; a V-pit generation layer disposed on the n-type nitride semiconductor layer and having a V-pit; a lower active layer disposed on the V-pit generation layer; an upper active layer disposed on the lower active layer; an intermediate layer disposed between the lower active layer and the upper active layer; and a second conductivity type nitride semiconductor layer disposed on the upper active layer, in which the lower active layer and the upper active layer emit light having different peak wavelengths from each other.

The intermediate layer may include a semiconductor layer having a composition formula of $In_xAl_yGa_{1-x-y}N$ ($0 \leq x \leq 1$, $0 \leq y \leq 1$, $0 \leq x\ y < 1$).

The intermediate layer may have a thickness of greater than 12 nm and less than or equal to 26 nm.

The upper active layer may include a first well region disposed over a flat surface of the V-pit generation layer and a second well region formed along an inclined surface of the V-pit, and a well layer of the first well region may include a more In content than that of a well layer of the second well region.

The lower active layer may emit light having a wavelength shorter than that of the upper active layer, and an intensity of light emitted from the lower active layer may be greater than that of light emitted from the upper active layer.

The light emitting diode may emit light having at least two peak wavelengths in a visible light region, and an intensity at a longest peak wavelength may be less than an intensity at least one other peak wavelength.

The light emitting diode may emit light located within a region with color coordinates (x, y) surrounded by coordinates of four points: (0.012, 0.494), (0.2, 0.4), (0.2, 0.32), (0.04, 0.32) on a CIE 1931 color space chromaticity diagram.

The light emitting diode may further include an upper step coverage layer disposed between the second conductivity type semiconductor layer and the upper active layer, in which the upper step coverage layer may include a nitride semiconductor layer including Al.

The step coverage layer may have a wider band gap than that of a barrier layer of the upper active layer.

The upper active layer includes a first well region disposed over the flat surface of the V-pit generation layer and a second well region formed along the inclined surface of the V-pit, a well layer of the first well region may include a more In content than that of a well layer of the second well region, and the second well region may not emit light.

The light emitting diode may further include a lower step coverage layer disposed between the intermediate layer and the lower active layer, and the lower step coverage layer may include a nitride-based semiconductor layer including Al.

The step coverage layer may include a region disposed over the flat surface of the V-pit generation layer and an inclined region formed on the inclined surface of the V-pit along the V-pit.

The light emitting diode may emit light located within a region with color coordinates (x, y) surrounded by coordinates of four points: (0.012, 0.494), (0.2, 0.4), (0.2, 0.32), (0.04, 0.32) on the chromaticity diagram of CIE 1931 color space, The light emitting diode may further include a lower step coverage layer disposed between the intermediate layer and the lower active layer, and the lower step coverage layer may include a nitride-based semiconductor layer including Al.

The lower step coverage layer may have a wider band gap than that of the intermediate layer.

The lower active layer includes a first well region disposed over the flat surface of the V-pit generation layer and a second well region formed along the inclined surface of the V-pit, a well layer of the first well region may include a more In content than that of a well layer of the second well region, and the second well region may not emit light.

A light emitting device according to an exemplary embodiment of the present disclosure includes: a first lead and a second lead; a housing covering the first lead and the second lead and defining a cavity; and a light emitting diode disposed in the cavity of the housing and electrically connected to the first and second leads, in which the light emitting diode includes: a first conductivity type nitride semiconductor layer; a V-pit generation layer disposed on the n-type nitride semiconductor layer and having a V-pit; a lower active layer disposed on the V-pit generation layer; an upper active layer disposed on the lower active layer; an intermediate layer disposed between the lower active layer and the upper active layer; and a second conductivity type nitride semiconductor layer disposed on the upper active layer, in which the lower active layer and the upper active layer emit light having different peak wavelengths from each other.

The light emitting diode may further include an upper step coverage layer disposed between the second conductivity type semiconductor layer and the upper active layer, and the upper step coverage layer may include a nitride semiconductor layer including Al.

The light emitting diode may emit light located within a region with color coordinates (x, y) surrounded by coordinates of four points: (0.012, 0.494), (0.2, 0.4), (0.2, 0.32), (0.04, 0.32) on the CIE 1931 color space chromaticity diagram.

The light emitting device may further include a reflector disposed on an inner wall of the housing, and the reflector may include white silicone.

A light emitting diode according to an exemplary embodiment of the present disclosure includes: a first conductivity type nitride semiconductor layer; a V-pit generation layer positioned on the first conductivity type nitride semiconductor layer and having V-pits; a lower active layer positioned on the V-pit generation layer; an upper active layer disposed on the lower active layer; an intermediate layer disposed between the lower active layer and the upper active layer; a second conductivity type nitride semiconductor layer disposed on the upper active layer; an upper step coverage layer disposed between the second conductivity type semiconductor layer and the upper active layer; and a lower step coverage layer disposed between the intermediate layer and the lower active layer, in which the light emitting diode emits light having a highest peak intensity in a wavelength range of 500 nm or more in a visible light region, in an electroluminescence spectrum.

The intermediate layer may include a semiconductor layer having a composition formula of $In_xAl_yGa_{1-x-y}N$ ($0 \leq x \leq 1$, $0 \leq y \leq 1$, $0 \leq x\ y < 1$).

The upper and lower step coverage layers may include a nitride semiconductor layer including Al.

Light having the highest peak intensity may have a wavelength of 600 nm or more.

The light emitting diode may emit light of a single peak in the visible light region.

A spectrum of light of the peak may be left and right asymmetric.

When a virtual center line I is formed based on a peak wavelength having the peak value, an area of a longer wavelength region of the EL spectrum from the virtual center line I may be larger than that of a shorter wavelength region of the EL spectrum.

In a spectrum of light of the peak, a wavelength difference value from the peak wavelength to a shorter wavelength edge of a full width at half maximum may be smaller than a wavelength difference value from the peak wavelength to a longer wavelength edge of the full width at half maximum.

The light emitting diode may emit red light.

The upper step coverage layer may have a wider band gap than that of a barrier layer of the upper active layer.

The upper active layer may include a first well region disposed over a flat surface of the V-pit generation layer and a second well region formed along an inclined surface of the V-pit, in which a well layer of the first well region may include a more In content than that of a well layer of the second well region, and the second well region may not emit light.

The lower step coverage layer may have a wider band gap than that of the intermediate layer.

The lower step coverage layer may include a region disposed over the flat surface of the V-pit generation layer and an inclined region formed on the inclined surface of the V-pit along the V-pit.

The lower active layer may include a first well region disposed over the flat surface of the V-pit generation layer and a second well region formed along the inclined surface of the V-pit, in which a well layer of the first well region may include a more In content than that of a well layer of the second well region, and the second well region may not emit light.

The light emitting diode may emit light of a single peak in the visible light region.

A light emitting device according to an exemplary embodiment of the present disclosure includes a first lead and a second lead; a housing covering the first lead and the second lead and defining a cavity; and a light emitting diode disposed in the cavity of the housing and electrically connected to the first and second leads, in which the light emitting diode includes: a first conductivity type nitride semiconductor layer; a V-pit generation layer positioned on the n-type nitride semiconductor layer and having V-pits; a lower active layer positioned on the V-pit generation layer; an upper active layer disposed on the lower active layer; an intermediate layer disposed between the lower active layer and the upper active layer; a second conductivity type nitride semiconductor layer disposed on the upper active layer; an upper step coverage layer disposed between the second conductivity type semiconductor layer and the upper active layer; and a lower step coverage layer disposed between the intermediate layer and the lower active layer, in which the light emitting diode emits light having a highest peak intensity in a wavelength range of 500 nm or more in a visible light region, in an electroluminescence spectrum.

The upper and lower step coverage layers may include a nitride semiconductor layer including Al. Light having the highest peak intensity may have a wavelength of 600 nm or more.

A light spectrum of the peak may be left and right asymmetric.

The light emitting device may further include a reflector disposed on an inner wall of the housing, and the reflector may include white silicone.

DETAILED DESCRIPTION OF EMBODIMENTS

Figure 1:
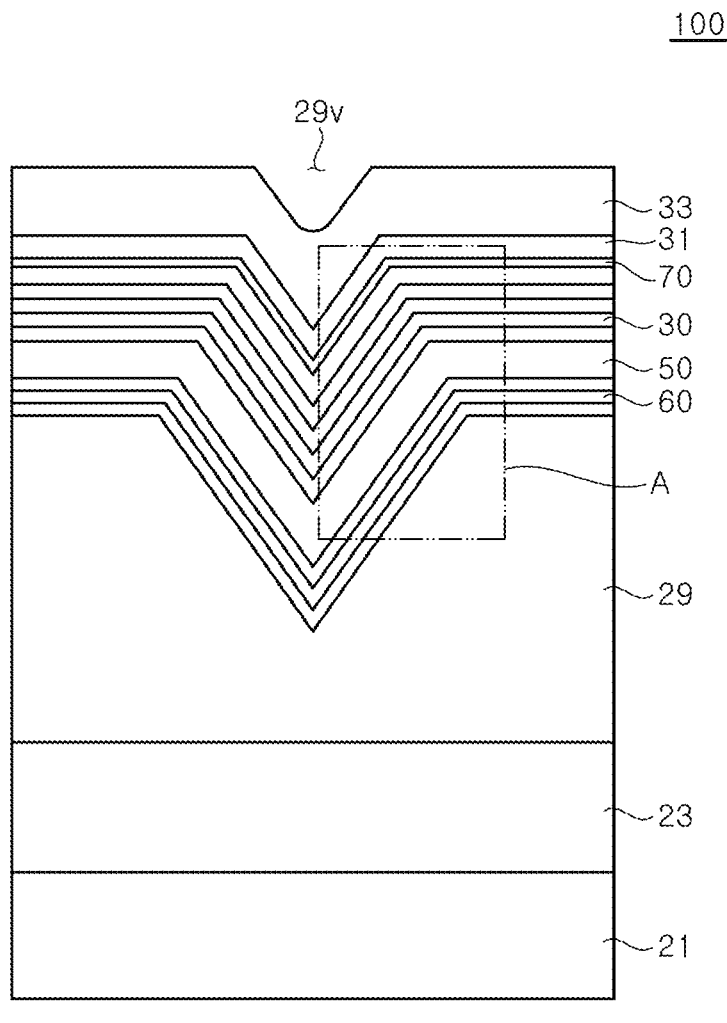
FIG. 1 is a schematic cross-sectional view illustrating a light emitting diode according to a first exemplary embodiment.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the exemplary embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

Figure 2A:
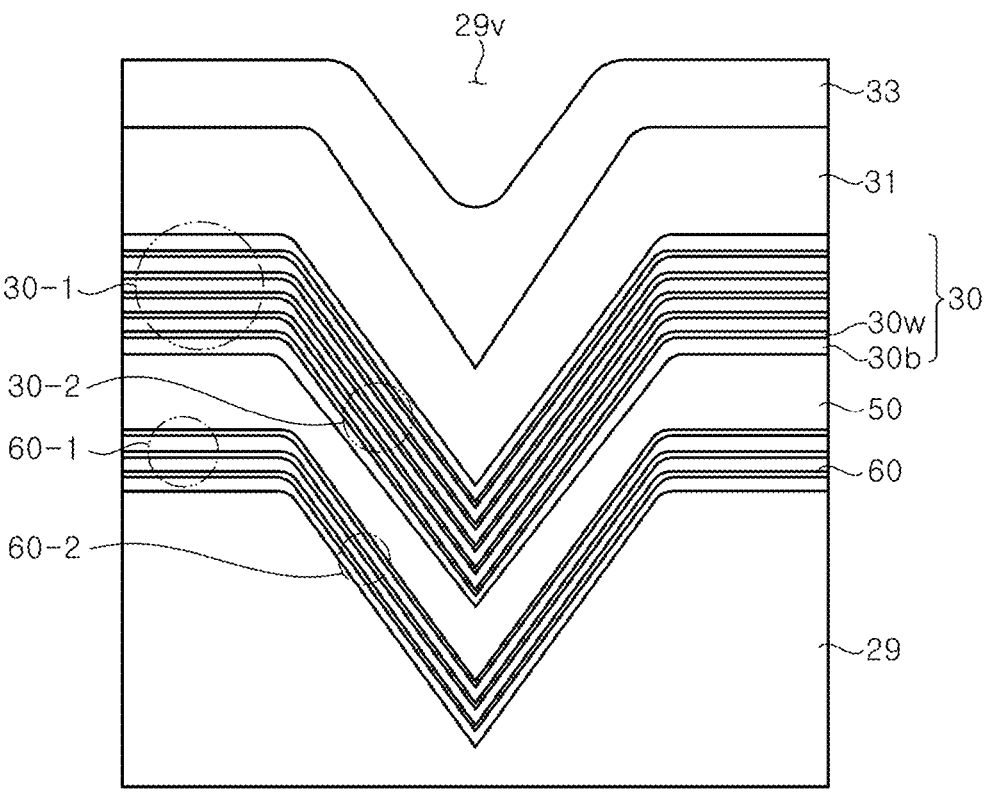
FIG. 2A is a schematic partial cross-sectional view showing an enlarged portion of FIG. 1.
Figure 2B:
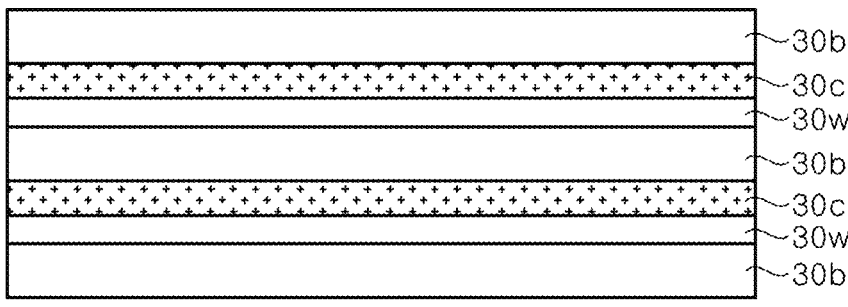
FIG. 2B is a schematic partial cross-sectional view illustrating an enlarged portion of FIG. 2A to describe an upper active layer of the light emitting diode according to the first exemplary embodiment of the present disclosure.
Figure 3:
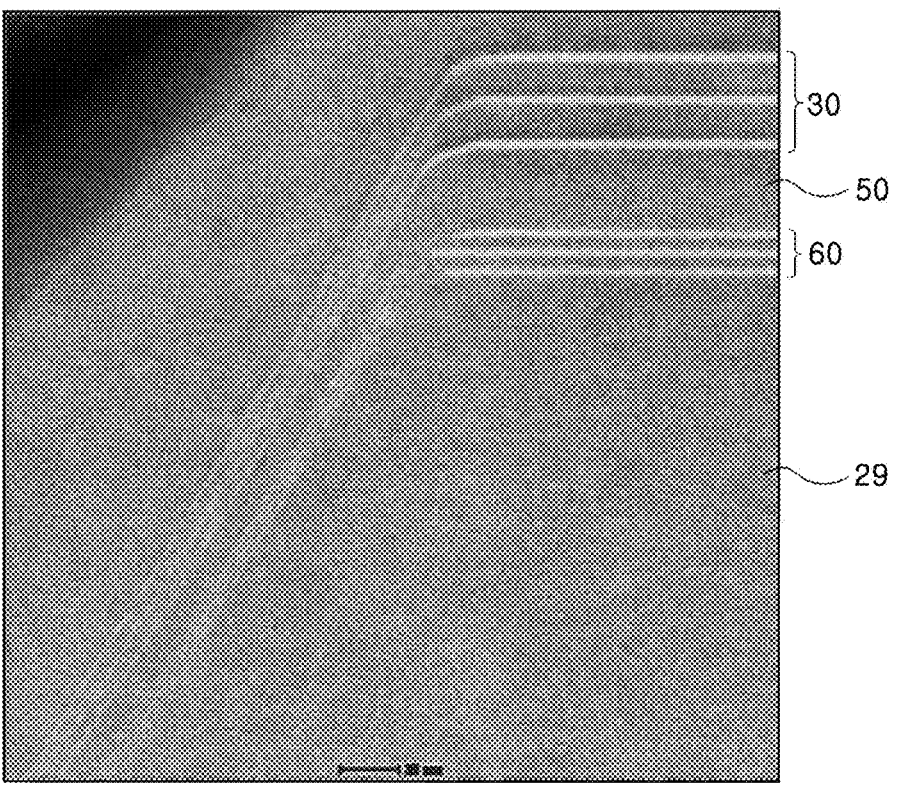
FIG. 3 is a transmission electron microscopy (TEM) photograph of the light emitting diode fabricated according to the first exemplary embodiment of the present disclosure, which shows a region corresponding to region A illustrated in FIG. 1.

FIG. 1 is a schematic cross-sectional view illustrating a light emitting diode 100 according to a first exemplary embodiment, FIG. 2A is a schematic partial cross-sectional view showing an enlarged portion of FIG. 1, and FIG. 2B is a schematic partial cross-sectional view illustrating an enlarged portion of FIG. 2A to describe an upper active layer of the light emitting diode according to the first exemplary embodiment of the present disclosure. FIG. 3 is a transmission electron microscopy (TEM) photograph of the light emitting diode fabricated according to the first exemplary embodiment of the present disclosure, which shows a region corresponding to region A illustrated in FIG. 1.

Referring to FIG. 1 and FIG. 2A, the light emitting diode 100 according to the first exemplary embodiment of the present disclosure includes a lower active layer 60, an upper active layer 30, and an intermediate layer 50. Furthermore, the light emitting diode 100 may include a substrate 21, a first conductivity type nitride semiconductor layer 23, a V-pit generation layer 29, and a second conductivity type nitride semiconductor layer 33, and may further include an electronic blocking layer 31. FIG. 2A shows the V-pit generation layer 29, the second active layer 60, the intermediate layer 50, the first active layer 30, a p-type AlGaN layer 31, a p-type nitride semiconductor layer 33, and a V-pit 29v.

The substrate 21 is a growth substrate for growing a gallium nitride-based semiconductor layer, and may be, for example, a sapphire substrate, a GaN substrate, a SiC substrate, a Si substrate, a spinel substrate, or the like. The substrate 21 may have protrusions, and may be, for example, a patterned sapphire substrate. However, the inventive concepts are not limited thereto, and may be a substrate having a flat upper surface, for example, a sapphire substrate.

The first conductivity type nitride semiconductor layer 23 may include a nitride-based semiconductor layer doped with an n-type impurity, and may be formed of, for example, a GaN layer doped with Si. A Si doping concentration doped in the first conductivity type nitride semiconductor layer 23 may be $5 \times 10^{17}/cm^3$ to $5 \times 10^{19}/cm^3$. The first conductivity type nitride semiconductor layer 23 may be grown by supplying a metallic source gas into a chamber using Metal Organic Chemical Vapor Deposition (MOCVD) technology under a growth pressure of 150 Torr to 200 Torr at 1000° C. to 1200° C. (e.g., 1050° C. to 1100° C.).

The first conductivity type semiconductor layer 23 may include an n-type contact layer. In addition, to grow the first conductivity type nitride semiconductor layer 23 on the substrate 21, a nucleation layer and a high-temperature buffer layer may be additionally formed. The nucleation layer, the high-temperature buffer layer, and the first conductivity type nitride semiconductor layer 23 may be continuously formed on the substrate 21 in the chamber, and threading dislocations formed in the high-temperature buffer layer may be transferred to the first conductivity type nitride semiconductor layer 23.

The first conductivity type nitride semiconductor layer 23 may have a first refraction index n1, and a surface in which the first conductivity type nitride semiconductor layer 23 is in contact with a patterned substrate 21 may be an interface in which a refraction index thereof changes. The substrate 21 may have a refraction index smaller than that of the first conductivity type nitride semiconductor layer 23, and thus, when light generated in the active layers 30 and 60 is incident on the substrate 21, it may be refracted at an angle greater than an incident angle with respect to a normal of the interface. Accordingly, by employing the substrate 21 having the refraction index smaller than that of the first conductivity type nitride semiconductor layer 23, light may be evenly distributed from an upper surface to a side surface of the substrate 21. The first conductivity type nitride semiconductor layer 23 may have a higher band gap energy than that of an energy of light generated in the light emitting diode 100. Accordingly, the first conductivity type nitride semiconductor layer 23 has a low light absorption rate with respect to light generated in the light emitting diode 100.

As shown in FIG. 1, the V-pit generation layer 29 is disposed on the first conductivity type nitride semiconductor layer 23. In an exemplary embodiment of the present disclosure, the V-pit generation layer 29 may be formed of, for example, a GaN layer. The V-pit generation layer 29 may be grown at a temperature relatively lower than that for growing the first conductivity type nitride semiconductor layer 23, for example, about 900° C., and thus, the V-pits 29v are formed in the V-pit generation layer 29.

By growing the V-pit generation layer 29 at the temperature relatively lower than that for growing the first conductivity type nitride semiconductor layer 23, the V-pit 29v may be formed by artificially lowering a crystal quality of the nitride semiconductor layer to be grown and promoting a three-dimensional growth.

The V-pits 29v may have a hexagonal pyramid shape when a growth plane of the nitride semiconductor layer is a c-plane. The V-pits 29v may be formed at upper ends of threading dislocations.

The V-pit generation layer 29 may be formed to have a thickness smaller than that of the first conductivity type nitride semiconductor layer 23, and for example, to have a thickness of about 450 nm to 600 nm. Sizes of the V-pits 29v formed in the V-pit generation layer 29 may be adjusted through a growth condition and a growth time of the V-pit generation layer 29. In an exemplary embodiment, a maximum width of an inlet of the V-pit 29v formed in the V-pit generation layer 29 may generally exceed about 200 nm.

In the illustrated exemplary embodiment, although it is described that the V-pit generation layer 29 is a single layer, the inventive concepts are not limited thereto, and may be multiple layers. For example, the V-pit generation layer 29 may include at least two of GaN, AlGaN, InGaN, or AlGaInN layers.

The thickness of the V-pit generation layer 29 particularly affects the size of the V-pit 29v. Moreover, the size of the V-pit 29v is considered to play a major role in generating light having a spectrum of multi-bands.

The V-pit generation layer 29 may have a higher band gap energy than an energy of light generated in the light emitting diode 100, and thus, it has a low light absorption rate with respect to light generated in the light emitting diode 100. In addition, the V-pit generation layer 29 may have a refraction index n2 that is smaller than those of well layers 30w and 60w of the active layers 30 and 60. Alternatively, the V-pit generation layer 29 may have the refraction index n2 greater than those of barrier layers 30b and 60b of the active layers 30 and 60.

The lower active layer 60, the intermediate layer 50, and the upper active layer 30 may be disposed on the V-pit generation layer 29. The lower active layer 60 and the upper active layer 30 may have a multi-quantum well structure, and may emit light by recombination of electrons and holes.

The lower active layer 60 and the upper active layer 60 may be disposed on the V-pit generation layer 29, and may be grown along the shape of the V-pit 29v formed in the V-pit generation layer 29. The lower active layer 60 and the upper active layer 30 may be configured, for example, as at least one of groups II-VI and groups III-V compound semiconductor.

As shown in FIGS. 2A and 2B, the upper active layer 30 includes a plurality of well layers 30w and a plurality of barrier layers 30b, in which the well layers 30w and the barrier layers 30b are alternately disposed. The well layer 30w and the barrier layer 30b may be formed of, for example, a semiconductor material having a composition formula of $In_xAl_yGa_{1-x-y}N$ ($0 \le x \le 1$, $0 \le y \le 1$, $0 \le x$ $y < 1$). For example, they may include at least one of pairs of InGaN/GaN, GaN/AlGaN, AlGaN/AlGaN, InGaN/AlGaN, InGaN/InGaN, AlGaAs/GaAs, InGaAs/GaAs, InGaP/GaP, AlIn-GaP/InGaP, or InP/GaAs.

As shown in FIG. 2B, the upper active layer 30 may further include a capping layer 30c disposed between the well layer 30w and the barrier layer 30b. The capping layer 30c may be formed prior to depositing the barrier layer 30b so as to prevent dissociation of In in the well layer 30w during the deposition of the barrier layer 30b. The capping layer 30c is not necessarily disposed and may be selectively applied.

Like the upper active layer 30, the lower active layer 60 may also have a structure in which a plurality of well layers and a plurality of barrier layers are alternately disposed. The lower active layer 60 may further include a capping layer disposed between the well layer and the barrier layer. However, the inventive concepts are not limited thereto, and the lower active layer 60 may not include the capping layer, and only the upper active layer 30 may include the capping layer. The lower active layer 60 emits light having a shorter wavelength than that of the upper active layer 30, and thus, the well layer of the lower active layer 60 may have a wider band gap than that of the well layer 30w of the upper active layer 30. For example, an In content in the well layer of the lower active layer 60 is less than an In content in the well layer 30w of the upper active layer 30.

The upper active layer 30 and the lower active layer 60 may be grown along a shape of an upper surface of the V-pit generation layer 29, and may include first well regions 30-1 and 60-1 grown along a flat surface of the V-pit generation layer 29 and second well regions 30-2 and 60-2 grown along an inclined surface in the V-pit 29v of the V-pit generation layer 29.

The first well regions 30-1 and 60-1 are grown along the flat surface of the V-pit generation layer 29. More specifically, when a crystal plane of the flat surface is a (0001) plane, the first well regions 30-1 and 60-1 may be grown in a [0001] direction perpendicular to the substrate 21. In addition, the first well region 30-1 may have a composition that emits light having a longer wavelength spectrum of the multi-bands. The first well region 60-1 of the upper active layer 30 may have a composition that emits light having a shorter wavelength spectrum of the multi-bands. Meanwhile, the second well regions 30-2 and 60-2 are grown along the inclined surface of the V-pit 29v formed by the V-pit generation layer 29. More specifically, the inclined surface of the V-pit 29v has a crystal plane of (10-11) or {10-11}, and the second well regions 30-2 and 60-2 may be grown in a [10-11] or <10-11> direction. The second well regions 30-2 and 60-2 may have a hexagonal pyramid shape due to the crystal plane of the V-pit. The crystal plane {10-11} and a vector <10-11> of the inclined surface of the V-pit represent six inclined surfaces and six inclined axes of the V-pit in the hexagonal pyramid shape.

Meanwhile, the second well region 30-2 may emit light having a shorter wavelength than that of the first well region 30-1. For example, an In composition ratio in the first well region 30-1 is higher than an In composition ratio in the second well region 30-2. In an exemplary embodiment, the first well region 30-1 may be formed of InGaN having a composition that emits yellow light, and the second well region 30-2 may be formed of InGaN having a composition that emits green and/or blue light.

The second well region 30-2 may be formed with a same composition on each surface of the V-pit 29v, without being limited thereto, and may be formed with a different composition on each surface.

In the lower active layer 60, the first well region 60-1 has a third refraction index n3, and the second well region 60-2 has a fourth refraction index n4, in which the third refraction index n3 may be greater than the fourth refraction index n4. That is, the light emitting diode 100 may include regions having different refraction indices in one layer, such as the first well region 60-1 and the second well region 60-2. Assuming that a direction from the lower active layer 60 toward the substrate 21 is referred to as a first direction and a direction perpendicular to the first direction is referred to as a second direction, since the lower active layer 60 includes the regions having different refraction indices along the second direction, light extraction may be more effective, and an implementation of white light or colored light may be effective.

In another exemplary embodiment, a plurality of regions having the third refraction index n3 may be disposed, and a region having the fourth refraction index n4 may be disposed between the regions having the third refraction index n3.

In another exemplary embodiment, the regions having different refraction indices may be included in the first well region 60-1. Alternatively, the regions having different refraction indices may be included in the second well region 60-2. Since the regions having different refraction indices in a lateral direction are included in a same layer, the light extraction may be more effective, and the implementation of white light and colored light may be effective.

Since the light emitting diode 100 includes the regions having different refraction indices in a vertical direction and the lateral direction, the implementation of white light and colored light may be effective.

Although two active layers 30 and 60 haven been illustrated and described as being disposed in the illustrated exemplary embodiment, a larger number of active layers may be disposed.

Composition ratios of group III elements of the well layers in the active layers 30 and 60, that is, In, Al, and Ga, may be selected according to a desired light. The upper active layer 30 and the lower active layer 60 may emit light having different peak wavelengths from each other. In an exemplary embodiment, a band of light emitted from the upper active layer 30 and a band of light emitted from the lower active layer 60 may be spaced apart from each other.

In another exemplary embodiment, the band of light emitted from the upper active layer 30 and the band of light emitted from the lower active layer 60 may partially overlap.

In an exemplary embodiment, the lower active layer 60 may emit light having a shorter wavelength than a wavelength of light emitted from the upper active layer 30. A peak wavelength of light emitted from the lower active layer 60 may be in a range of about 350 nm to 500 nm. For example, the lower active layer 60 may include an InGaN well layer and a GaN barrier layer, and thicknesses of the well layer and the barrier layer are, for example, about 3.0 nm and about 5.8 nm, respectively, in which an Indium concentration in the well layer may be about 15% so as to emit light having the shorter wavelength. In addition, the lower active layer 60 may include a superlattice structure.

The upper active layer 30 may emit light having a peak wavelength longer than a peak wavelength of light emitted from the lower active layer 30. The peak wavelength of light emitted from the upper active layer 30 may be in a range of about 500 nm to 600 nm. For example, the upper active layer 30 may include an InGaN well layer $30w$ and a GaN barrier layer $30b$, and thicknesses of the well layer and the barrier layer may be about 3.5 nm and about 10 nm, respectively. An Indium concentration in the well layer $30w$ of the upper active layer 30 is higher than an Indium concentration in the well layer of the lower active layer 60, and the concentration thereof may be, for example, about 20% to about 22%. However, the inventive concepts are not limited thereto, and materials and thicknesses of each of the active layers 30 and 60 are not limited thereto.

In the upper active layer 30, the first well region 30-1 has a fifth refraction index n5, the second well region 30-2 has a sixth refraction index n6, and the fifth refraction index n5 may be greater than the sixth refraction index n6. The upper active layer 30 may include regions having different refraction indices from one another in one layer. Assuming that a direction from the upper active layer 30 toward the substrate 21 is referred to as a first direction and a direction perpendicular to the first direction is referred to as a second direction, since the upper active layer 30 includes the regions having different refraction indices along the second direction, the light extraction may be more effective, and the implementation of white light and colored light may be effective.

In another exemplary embodiment, the upper active layer 30 may include a plurality of regions having the fifth refraction index n5, and regions having the sixth refraction index n6 may be disposed between the regions having the fifth refraction index n5.

In another exemplary embodiment, the regions having different refraction indices from one another may also be included in the first well region 30-1. The regions having different refraction indices from one another may also be included in the second well region 30-2. Since the upper active layer 30 includes the regions having different refractive indices, the light extraction may be more effective, and the implementation of white light and colored light may be effective.

Since the light emitting diode 100 includes the regions having different refraction indices in the vertical direction and the lateral direction, the implementation of white light and colored light may be effective.

The fifth refraction index n5 may have a refraction index greater than the third refraction index n3, and the sixth refraction index n6 may have a greater refraction index than the fourth refraction index n4. The first refraction index, the second refraction index, the third refraction index, and the fifth refraction index may have a relationship of n1≤n2≤n3≤n5.

The intermediate layer 50 may be disposed between the lower active layer 60 and the upper active layer 30.

The intermediate layer 50 may be formed of a semiconductor material having a composition formula of $In_xAl_yGa_{1-x-y}N$ (0≤x≤1, 0≤y≤1, 0≤x y<1), and may include a single layer or multiple layers.

The intermediate layer 50 may control an injection efficiency of holes into the lower active layer 60 when the light emitting diode 100 is driven between the upper active layer 30 and the lower active layer 60, and through this, an intensity of each band of light emitted from the light emitting diode may be adjusted. For example, by increasing an intensity of light having the shorter wavelength emitted from the lower active layer 60 using the intermediate layer 50, a color temperature of mixed-color light emitted from the light emitting diode may be lowered. Conversely, by reducing the intensity of light emitted from the lower active layer 60 using the intermediate layer 50, the color temperature of mixed light emitted from the light emitting diode may be increased.

By controlling the composition of the intermediate layer 50 or the thickness of the intermediate layer 50, the injection efficiency of holes injected from the second conductivity type semiconductor layer 33 into the lower active layer 60 may be adjusted. The thickness of the intermediate layer 50 may be generally greater than the thickness of the barrier layer $30b$. When the thickness of the intermediate layer 50 is increased, the number of holes injected into the lower active layer 60 may be reduced, and thus, the intensity of light emitted from the lower active layer 60 may be reduced. Conversely, when the thickness of the intermediate layer 50 is reduced, the number of holes injected into the lower active layer 60 may be increased to increase the intensity of light emitted from the lower active layer 60.

The intermediate layer 50 may have a seventh refraction index n7. The seventh refraction index n7 may be smaller than the third refraction index n3 and the fourth refraction index n4, and may be smaller than the fifth refraction index n5 and the sixth refraction index n6. Since the layer having a relatively small refraction index is disposed between the active layers 30 and 60, internal scattering of light is increased to increase a light extraction efficiency.

Moreover, an internal quantum efficiency of the nitride-based semiconductor layer emitting blue light is generally higher than that of the nitride-based semiconductor layer emitting yellow light. Accordingly, although the lower active layer 60 is disposed under the upper active layer 30, the intensity of light emitted from the lower active layer 60 may be made to be higher than that of light emitted from the upper active layer 30.

The second conductivity type nitride semiconductor layer 33 is disposed on the upper active layer 30. As shown in FIG. 1 and FIG. 2A, a current blocking layer 31 may be disposed between the second conductivity type nitride semiconductor layer 33 and the upper active layer 30. The current blocking layer 31 may include, for example, a p-type AlxGa1-xN layer.

The second conductivity type nitride semiconductor layer 33 may be formed of a semiconductor layer doped with a p-type impurity, for example, GaN. The second conductivity type nitride semiconductor layer 33 may be formed as a single layer or multiple layers, and may include a p-type contact layer. The second conductivity type nitride semiconductor layer 33 may have an eighth refraction index n9.

The second conductivity type nitride semiconductor layer 33 may have a lower light absorption rate than those of the well regions 30-1, 30-2, 60-1, and 60-2 with respect to light generated in the light emitting diode 100. As shown in FIG. 1, the second conductivity type nitride semiconductor layer 33 may have a concave groove over the V-pit 29v. In the illustrated exemplary embodiment, since the second conductivity type nitride semiconductor layer 33 does not completely fill the V-pit 29v, light loss that may occur while light generated in the second well region 30-2 in the V-pit 29v passes through the second conductivity type nitride semiconductor layer 33 may be reduced.

In addition, since a material layer having a refraction index different from that of the active layer 30, that is, the second conductivity type nitride semiconductor layer 33 is extended and disposed into a region surrounded by the first well region 30-1 of the active layer 30, the light extraction efficiency is increased by increasing scattering and total internal reflection of light generated in the active layer 30.

Figure 4:
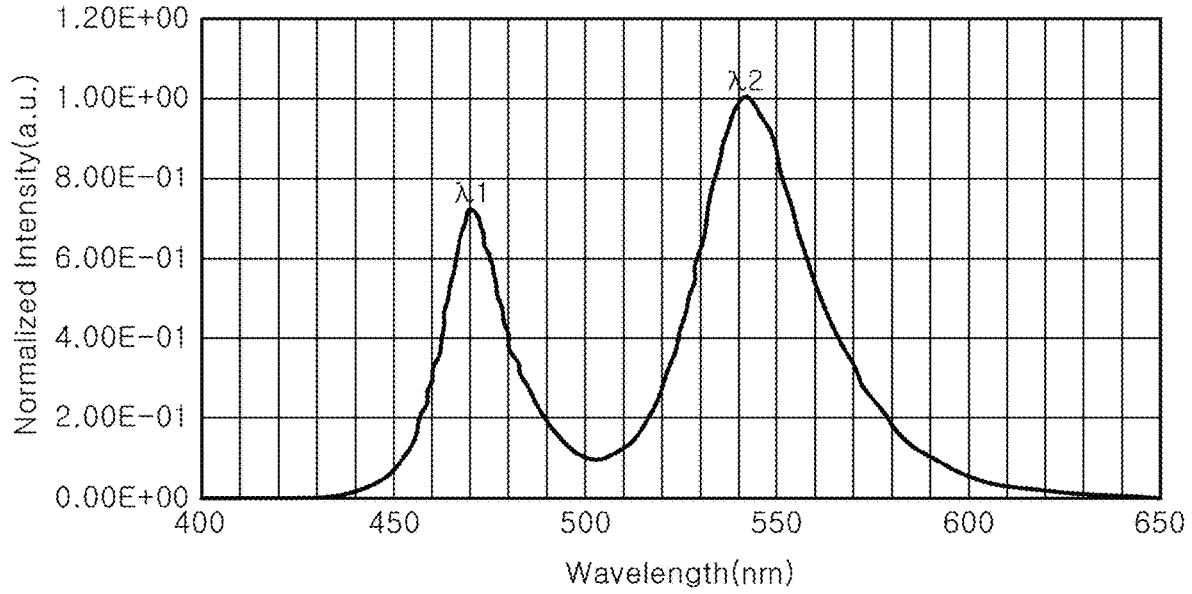
FIG. 4 is a graph showing an electroluminescence (EL) spectrum of the light emitting diode fabricated according to the first exemplary embodiment of the present disclosure.
Figure 5:
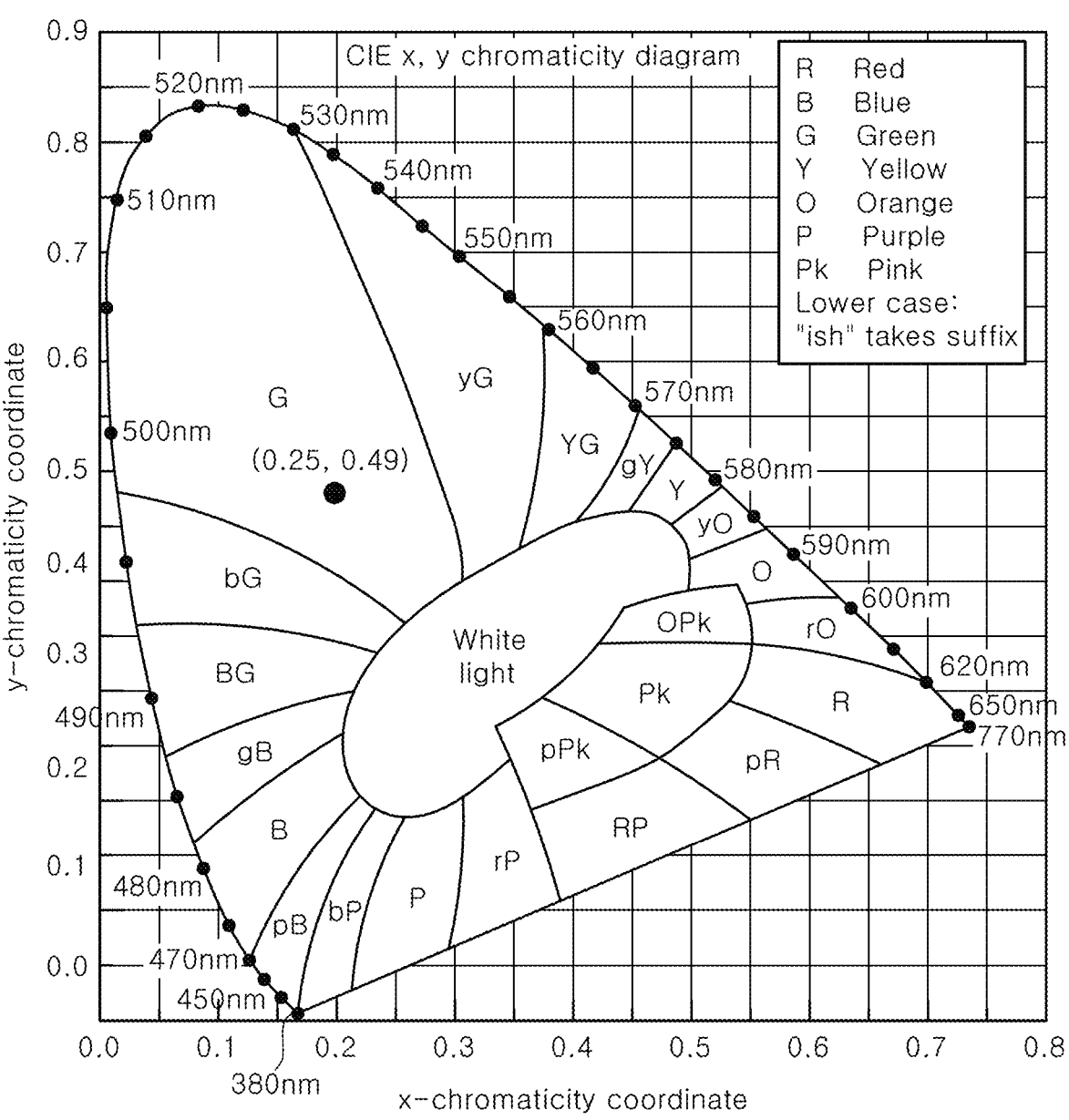
FIG. 5 is a graph in which color coordinates of the light emitting diode showing the spectrum of FIG. 4 are marked on a CIE 1931 color space chromaticity diagram.

FIG. 4 is a graph showing an electroluminescence (EL) spectrum of the light emitting diode fabricated according to the first exemplary embodiment of the present disclosure, and FIG. 5 is a graph in which color coordinates of the light emitting diode showing the spectrum of FIG. 4 are marked on a CIE 1931 color space chromaticity diagram.

In the illustrated exemplary embodiment, the thickness of the intermediate layer 50 was about 26 nm, and two peak wavelengths $\lambda1$ and $\lambda2$ can be identified in a visible light region. A relatively shorter peak wavelength ($\lambda1$) and a relatively longer peak wavelength ($\lambda2$) are observed. The light emitting diode has a color coordinate (x, y) of x=0.25 and y=0.49, and emits white light close to green. Characteristics of the spectrum of light emitted from the light emitting diode are summarized in Table 1 below.

TABLE 1

|  | $\lambda1$ | $\lambda2$ |
|---|---|---|
| Wp [nm] (Peak Wavelength) | 472 | 542 |
| FWHM [nm] | 20 | 35 |
| Intensity [a.u.] | 0.7 | 1 |
| CIE (x, y) | x = 0.25, y = 0.49 | |

Referring to Table 1, the light emitting diode emits light having two peak wavelengths ($\lambda1$, $\lambda2$), and there is a difference in intensities and full widths at half maximum (FWHM) In particular, the intensity and the FWHM of a longer wavelength band are greater than the intensity and the FWHM of a shorter wavelength band. Accordingly, it can be seen that the intensity of light emitted from the upper active layer 30 is higher than that of light emitted from the lower active layer 60. Meanwhile, it can be seen that the shorter wavelength band and the longer wavelength band partially overlap.

Figure 6:
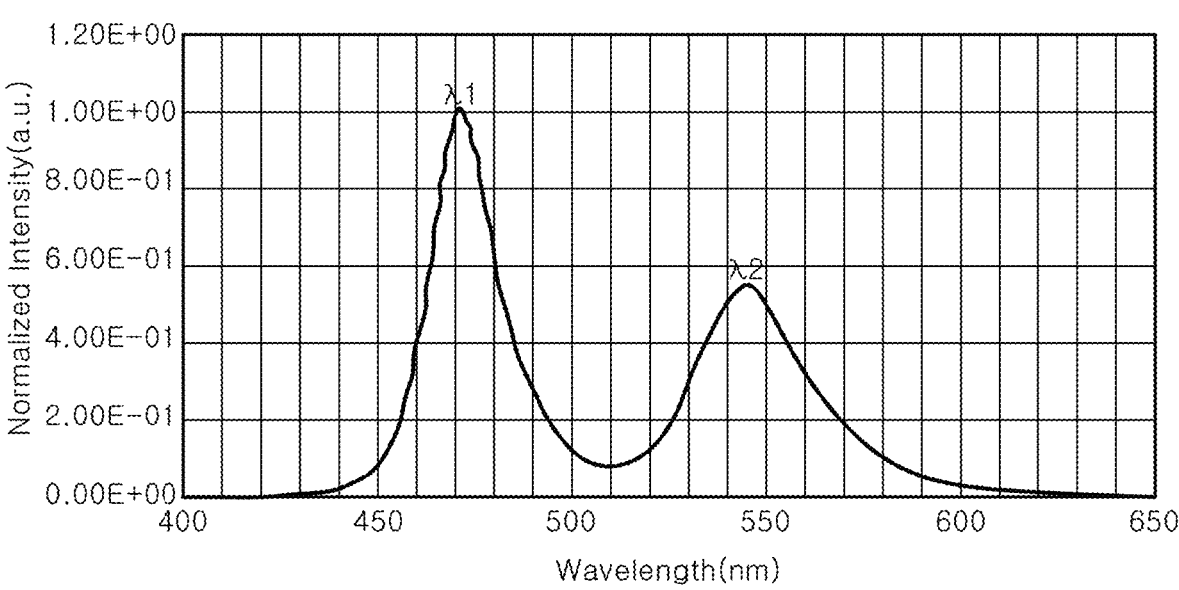
FIG. 6 is a graph showing an electroluminescence (EL) spectrum of another light emitting diode fabricated according to the first exemplary embodiment of the present disclosure.
Figure 7:
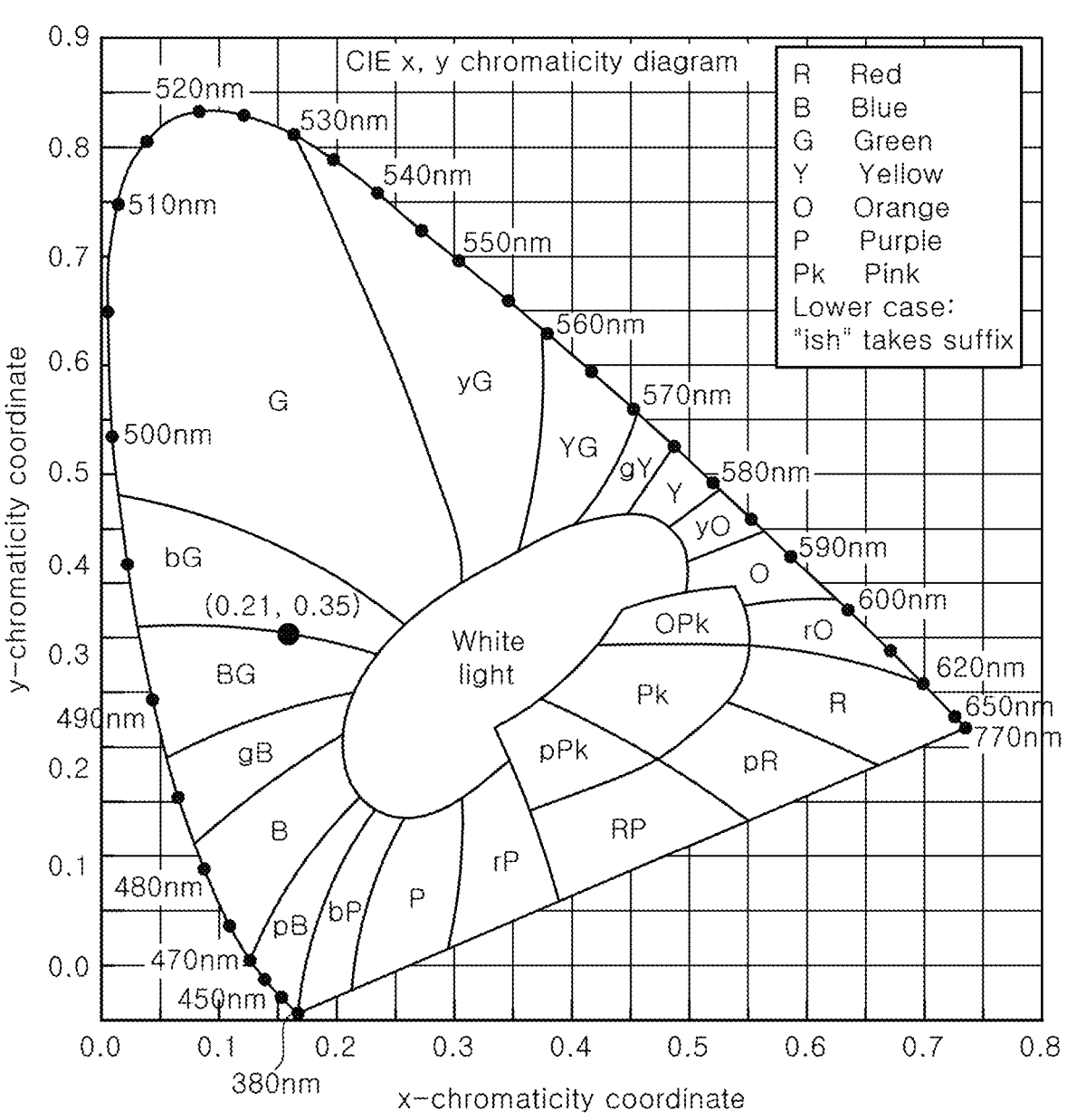
FIG. 7 is a graph in which color coordinates of the light emitting diode showing the spectrum of FIG. 6 are marked on the CIE 1931 color space chromaticity diagram.

FIG. 6 is a graph showing an electroluminescence (EL) spectrum of another light emitting diode fabricated according to the first exemplary embodiment of the present disclosure, and FIG. 7 is a graph in which color coordinates of the light emitting diode showing the spectrum of FIG. 6 are marked on the CIE 1931 color space chromaticity diagram.

The light emitting diode according to the illustrated exemplary embodiment is substantially same as the light emitting diode of FIG. 4, except that it is fabricated by reducing a thickness of an intermediate layer 50 to about 13 nm. The light emitting diode according to the illustrated exemplary embodiment also emitted light having two peak wavelengths ($\lambda1$, $\lambda2$) in the visible light region. A relatively shorter peak wavelength ($\lambda1$) and a relatively longer peak wavelength ($\lambda2$) are observed. The light emitting diode has a color coordinate (x, y) of x=0.21 and y=0.35, and emits white light close to blue. Characteristics of the spectrum of light emitted from the light emitting diode are summarized in Table 2 below.

TABLE 2

|  | $\lambda1$ | $\lambda2$ |
|---|---|---|
| Wp [nm] | 471 | 545 |
| FWHM [nm] | 20 | 36 |
| Intensity [a.u.] | 1 | 0.54 |
| CIE x, y | x = 0.21, y = 0.35 | |

Referring to Table 2, the light emitting diode emits light having two peak wavelengths ($\lambda1$, $\lambda2$), and there is a difference in intensities and full widths at half maximum (FWHM) In particular, an intensity of a shorter wavelength band is greater than that of a longer wavelength band. In addition, a full width at half maximum of the longer wavelength band is larger than that of the shorter wavelength band. According to this, it can be seen that an intensity of light emitted from a lower active layer 60 is higher than that of light emitted from an upper active layer 30. In addition, since the lower active layer 60 has a better crystal quality, a full width at half maximum of a spectrum of light emitted from the lower active layer 60 is narrower than that of a spectrum of light emitted from the upper active layer 30. Meanwhile, it can be seen that the shorter wavelength band and the longer wavelength band partially overlap.

By controlling the thickness of the intermediate layer, the intensities of bands of light emitted from the light emitting diode may be modified, and thus, light having a desired color coordinate may be implemented. Accordingly, by controlling the thickness of the intermediate layer 50, mixed light having the desired color temperature, for example, white light, may be implemented without using an additional phosphor layer or light emitting diodes having different colors.

In the exemplary embodiments of the present disclosure, an interval between the two peak wavelengths $\lambda1$ and $\lambda2$ may be in a range of about 50 nm to 100 nm.

Although light of two peak wavelengths is observed in the EL spectrum of light emitted from a single light emitting diode in the exemplary embodiments of the present disclosure, the peak wavelength is not limited to two, and may have more peak wavelengths.

Figure 8:
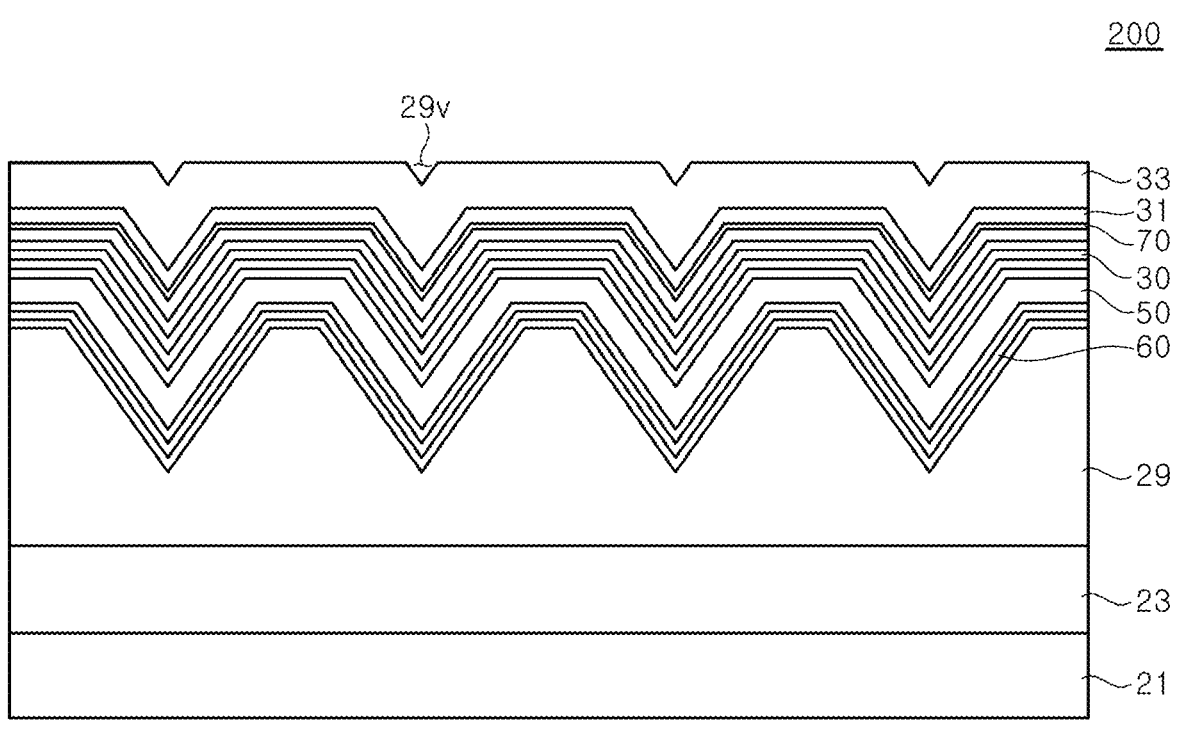
FIG. 8 is a schematic cross-sectional view illustrating a light emitting diode according to a second exemplary embodiment.
Figure 9:
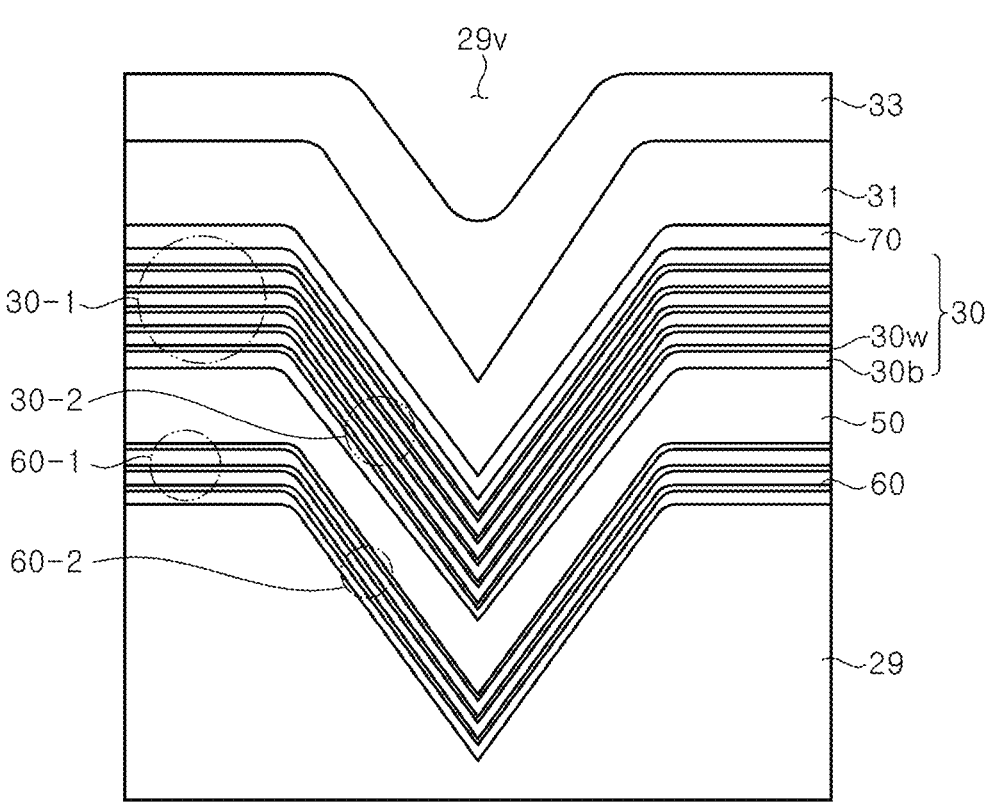
FIG. 9 is a schematic partial cross-sectional view illustrating an enlarged portion of FIG. 8.
Figure 10:
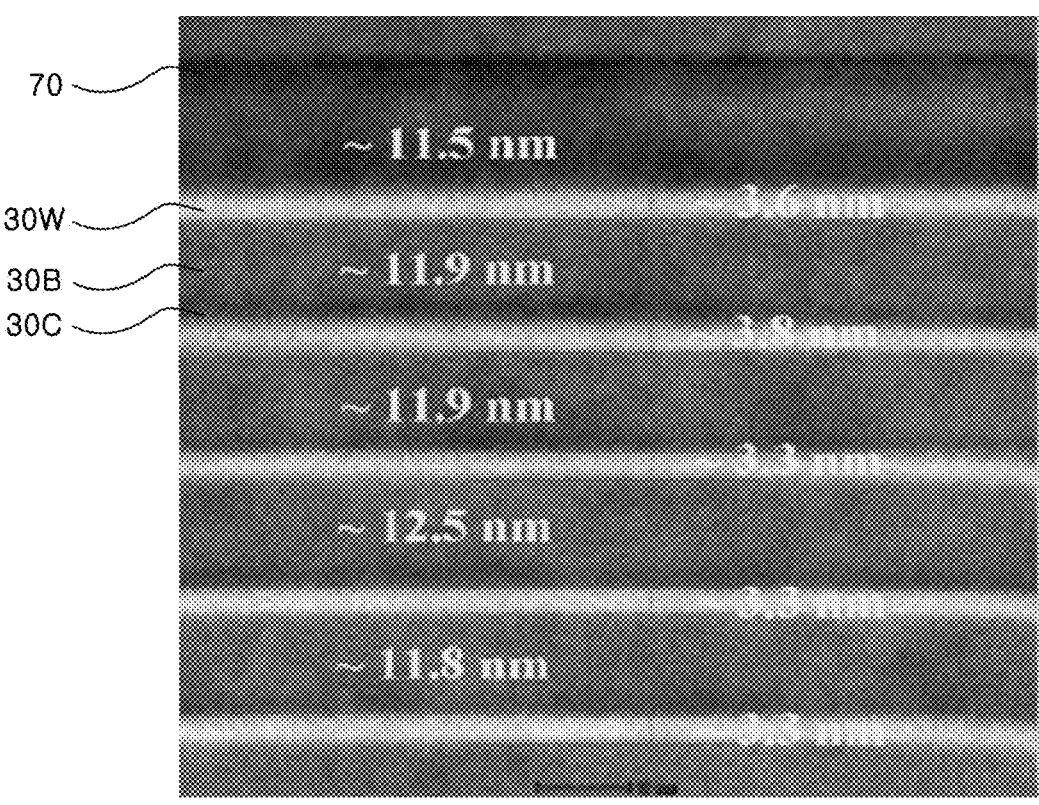
FIG. 10 is a transmission electron microscopy (TEM) photograph of the light emitting diode fabricated according to the second exemplary embodiment of the present disclosure, which shows a region corresponding to a partial region of FIG. 9.

FIG. 8 is a schematic cross-sectional view illustrating a light emitting diode 200 according to a second exemplary embodiment of the present disclosure, FIG. 9 is a schematic partial cross-sectional view illustrating an enlarged portion of FIG. 8, and FIG. 10 is a transmission electron microscopy (TEM) photograph of the light emitting diode fabricated according to the second exemplary embodiment of the present disclosure, which shows a region corresponding to a partial region of FIG. 9.

Referring to FIG. 8 and FIG. 9, the light emitting diode 200 according to the illustrated exemplary embodiment includes a lower active layer 60, an intermediate layer 50, an upper active layer 30, and an upper step coverage layer 70. The light emitting diode 200 may also include a substrate 21, a first conductivity type nitride semiconductor layer 23, a V-pit generation layer 29, a current blocking layer 31, and a second conductivity type nitride semiconductor layer 33.

Since the substrate 21, the first conductivity type nitride semiconductor layer 23, the V-pit generation layer 29, the lower active layer 60, the intermediate layer 50, the upper active layer 30, the current blocking layer 31, and the second conductivity type nitride semiconductor layer 33 are same as those described with reference to FIG. 1, FIG. 2A, and FIG. 2B, detailed descriptions thereof will be omitted to avoid redundancy.

The upper step coverage layer 70 may be formed on the upper active layer 30. The upper step coverage layer 70 may be disposed between the second conductivity type semiconductor layer 33 and the upper active layer 30, or between the current blocking layer 31 and the upper active layer 30. The upper step coverage layer 70 may be formed with a composition of a nitride-based semiconductor layer including Al, and may be formed to be thicker than a well layer 30w of the upper active layer 30. The upper step coverage layer 70 may be a single layer or multiple layers. Although the illustrated exemplary embodiment describes that the upper step coverage layer 70 is disposed on the upper active layer 30, a location of the upper step coverage layer 70 is not limited thereto. The step coverage layer 70 may have a ninth refraction index n9. The ninth refraction index n9 may be smaller than respective refraction indices of layers disposed over and under the step coverage layer 70. In addition, the step coverage layer 70 may have a smallest refraction index among the nitride semiconductor layers constituting the light emitting diode 100.

The upper step coverage layer 70 prevents light from being generated in a second well region 30-2 of the upper active layer 30. That is, in the illustrated exemplary embodiment, light is not emitted from the second well region 30-2 by introducing the upper step coverage layer 70.

As described in the first exemplary embodiment of the present disclosure, the first well region 30-1 and the second well region 30-2 of the upper active layer may emit light of a specific peak wavelength depending on an In content in each well layer. However, since an In composition of the second well region 30-2 depends on an In composition of the first well region 30-1, it is difficult to control the In content in the second well region 30-2. Accordingly, it is difficult to control the wavelength of light emitted from the second well region 30-2. In the illustrated exemplary embodiment, light of a desired multi-bands may be easily implemented by preventing light from being emitted from the second well region 30-2, and allowing the lower active layer 60 to emit light of a shorter wavelength band.

According to the illustrated exemplary embodiment, by improving a crystal quality through reducing threading dislocations by using a V-pit 29v and also introducing the step coverage layer 70, it is possible to easily implement light of a spectrum of multi-bands having a desired peak wavelength. In addition, by applying the step coverage layer 70, electrical characteristics such as turn on voltage may be improved.

Figure 11:
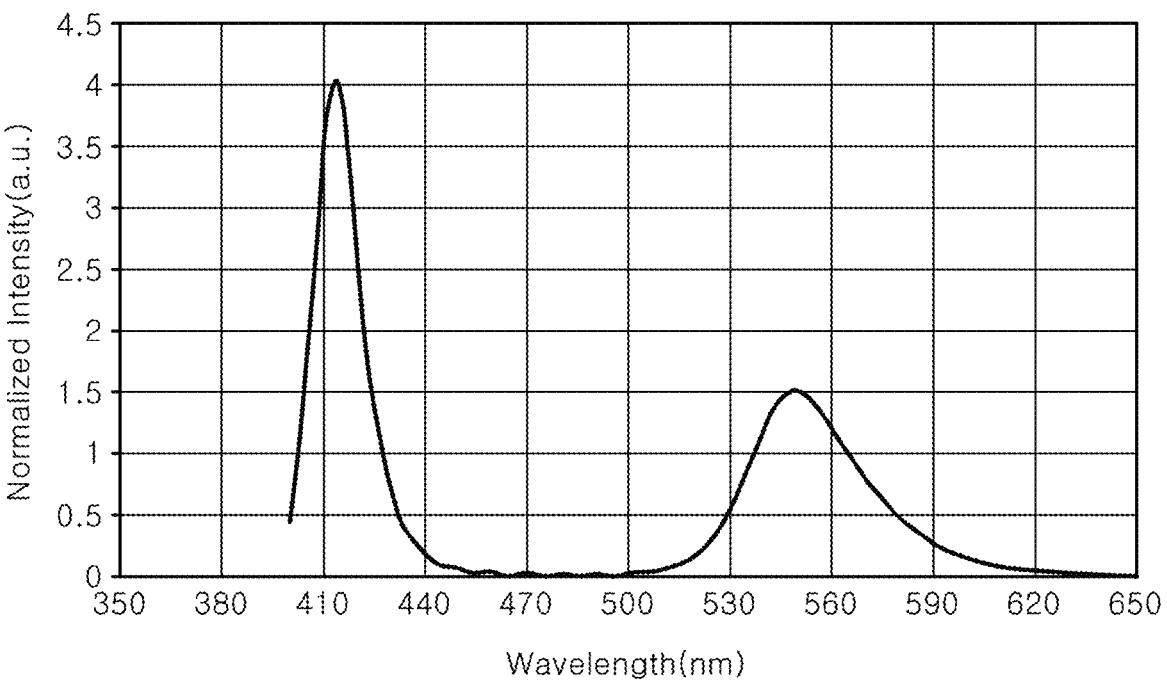
FIG. 11 is a photoluminescence (PL) measurement graph of the light emitting diode fabricated according to the second exemplary embodiment of the present disclosure.
Figure 12:
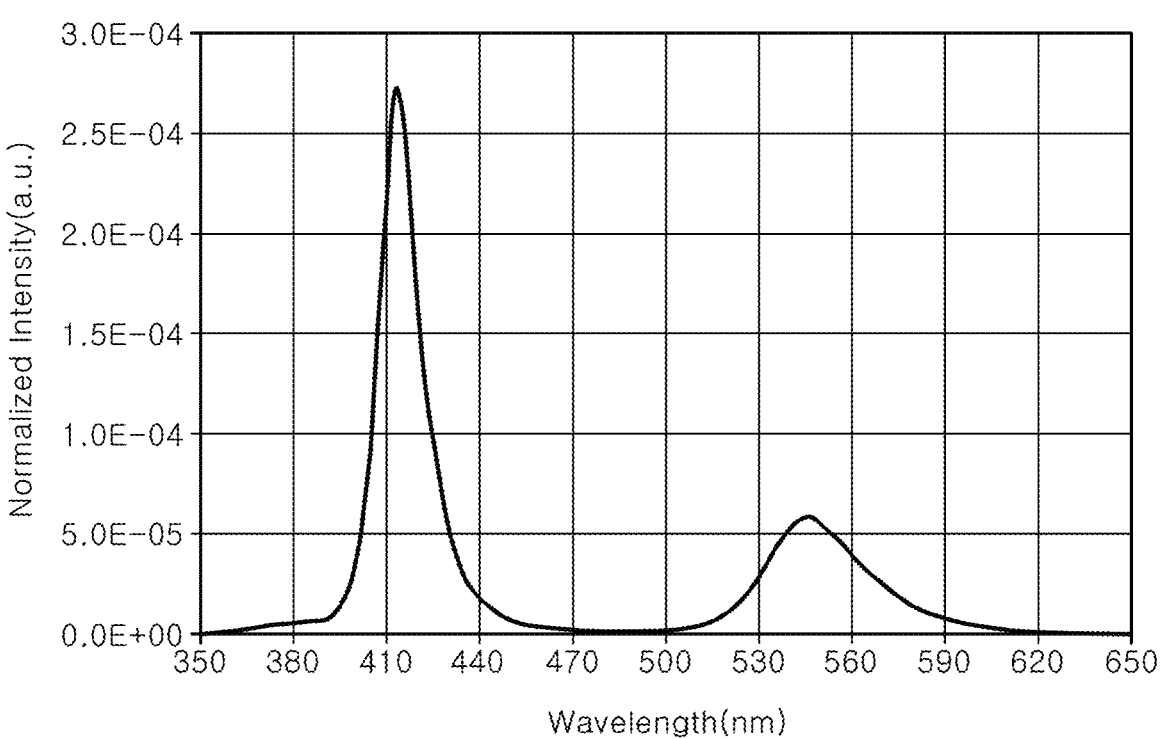
FIG. 12 is an electroluminescence (EL) measurement graph of the light emitting diode fabricated according to the second exemplary embodiment of the present disclosure.

FIG. 11 is a photoluminescence (PL) measurement graph of the light emitting diode fabricated according to the second exemplary embodiment of the present disclosure, and FIG. 12 is an EL (electroluminescence) measurement graph of the light emitting diode fabricated according to the second exemplary embodiment of the present disclosure.

Referring to FIG. 11 and FIG. 12, it can be seen that light emitted from the upper active layer 30 and the lower active layer 60 have two peak wavelengths. Although the peak wavelength of light emitted from the lower active layer 60 is about 413 nm, two peak wavelengths appear because light is not emitted from the second well region 30-2 of the upper active layer 30. By introducing the upper step coverage layer 70, an injection of holes into the second well region 30-2 may be blocked, and thus, it is judged that light is not generated in the second well region 30-2 of the upper active layer 30. Furthermore, according to the illustrated exemplary embodiment, it can be seen that a shorter wavelength band and a longer wavelength band do not overlap but are spaced apart from each other.

Figure 13:
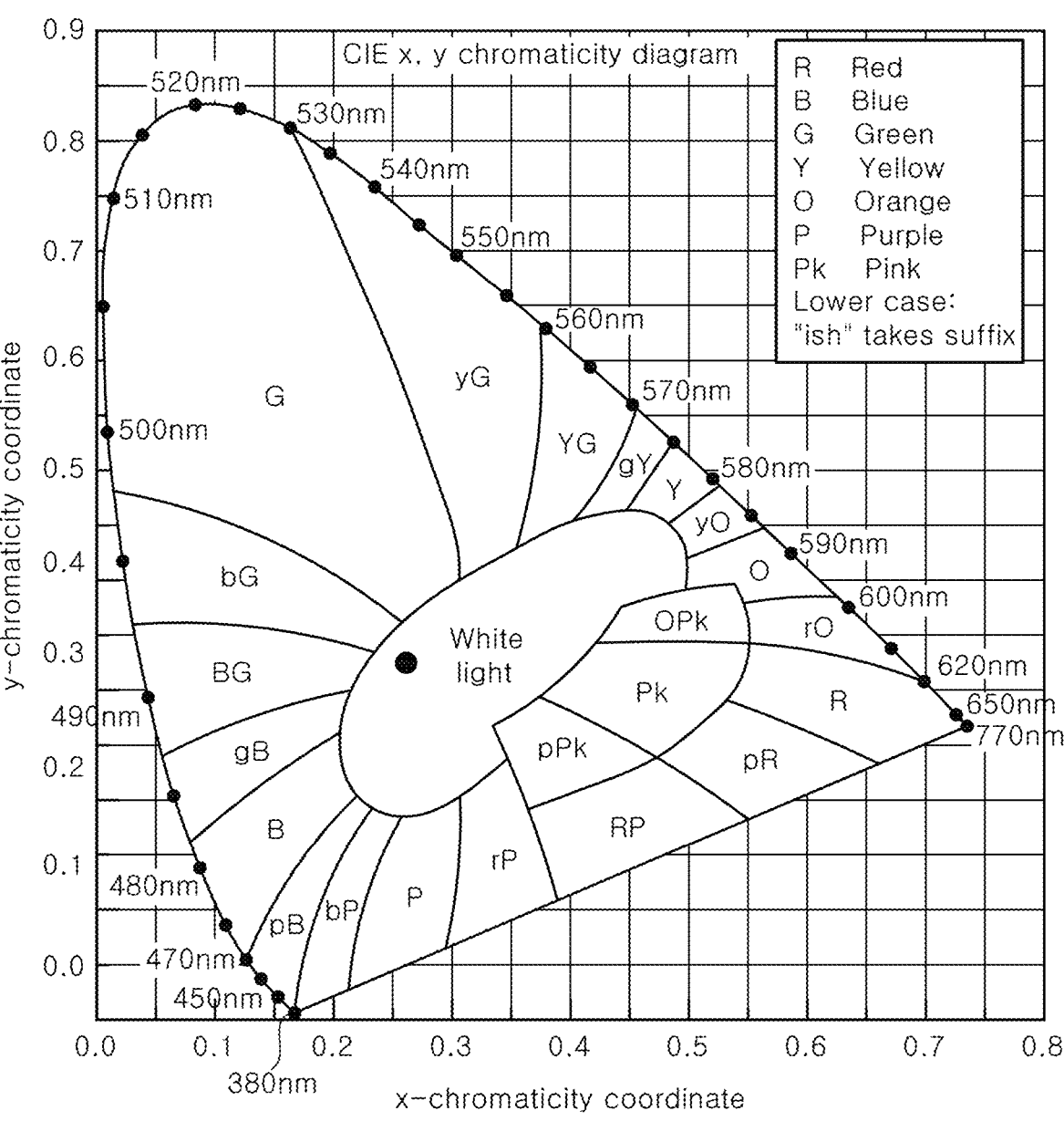
FIG. 13 is a graph in which color coordinates of the light emitting diode fabricated according to the second exemplary embodiment are marked on the CIE 1931 color space chromaticity diagram.

FIG. 13 is a graph in which color coordinates of the light emitting diode fabricated according to the second exemplary embodiment are marked on the CIE 1931 color space chromaticity diagram.

Referring to FIG. 13, it can be seen that white light having a relatively low color temperature is emitted. White light may be implemented using light of multi-bands emitted within a single light emitting diode.

Table 3 below shows a correlation between complementary color wavelengths for implementing white, and white light may be implemented by designing the upper active layer 30 and the lower active layer 60 so as to emit light of a complementary color.

TABLE 3

| Complementary Color | | Luminous Intensity Ratio |
|---|---|---|
| $\lambda 1$(nm) | $\lambda 2$(nm) | $P(\lambda 2)/P(\lambda 1)$ |
| 380-400 | 540-570 | 0.000642-0.0785 |
| 400-420 | 540-570 | 0.0785-0.89 |
| 420-430 | 540-570 | 0.89-1.42 |
| 430-450 | 540-570 | 1.42-1.79 |
| 450-470 | 540-570 | 1.79-1.09 |
| 470-480 | 570-600 | 1.09-0.81 |
| 480-490 | 600-630 | 0.81-0.668 |

In Table 3, $\lambda 1$ is a peak wavelength of light emitted from the lower active layer 60, and $\lambda 2$ is a peak wavelength of light emitted from the upper active layer 30. The relationship of the complementary color wavelengths targets white light in coordinates x: 0.205~0.495 and y: 0.19~0.45.

In the illustrated exemplary embodiment, although the light emitting diode 200 has been exemplarily described as implementing white light, the inventive concepts are not limited thereto. Mixed light of various colors may be implemented using light emitted from the lower active layer 60 and the upper active layer 30. In this case, the upper step coverage layer 70 blocks light from being generated in the second well region 30-2 of the upper active layer 30, and thus, not only white light but also light of various colors may be implemented with the single light emitting diode by easily controlling the composition of the light emitting diode.

Figure 14A:
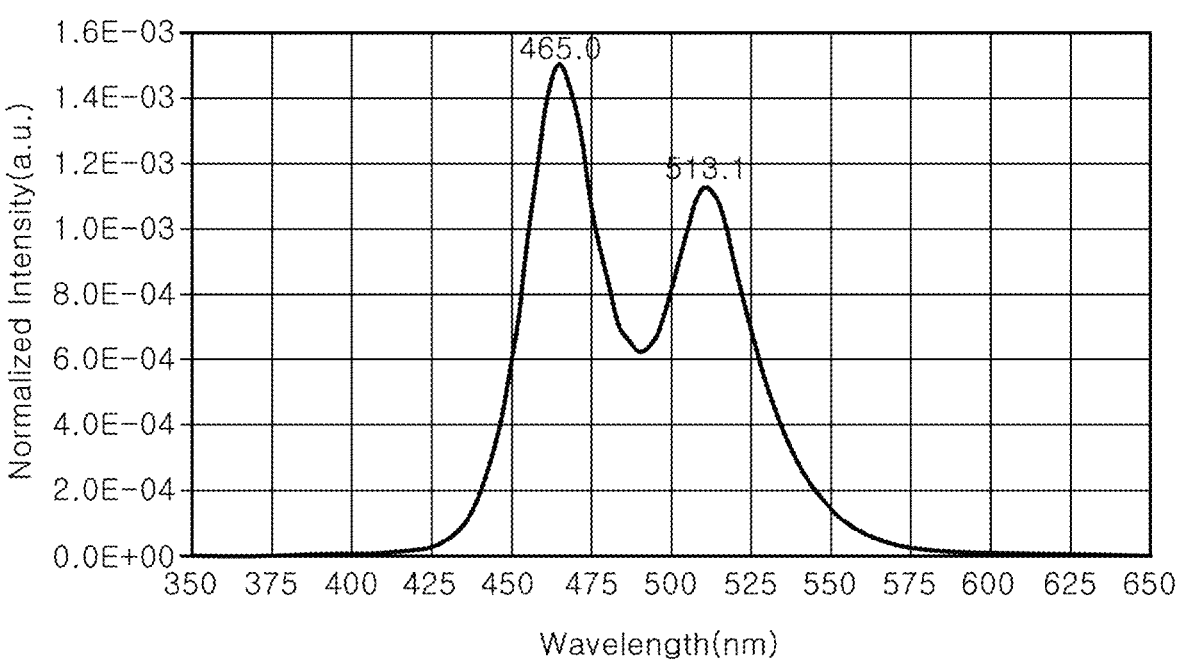
FIG. 14A is an electroluminescence (EL) measurement graph of another light emitting diode fabricated according to the second exemplary embodiment of the present disclosure.
Figure 14B:
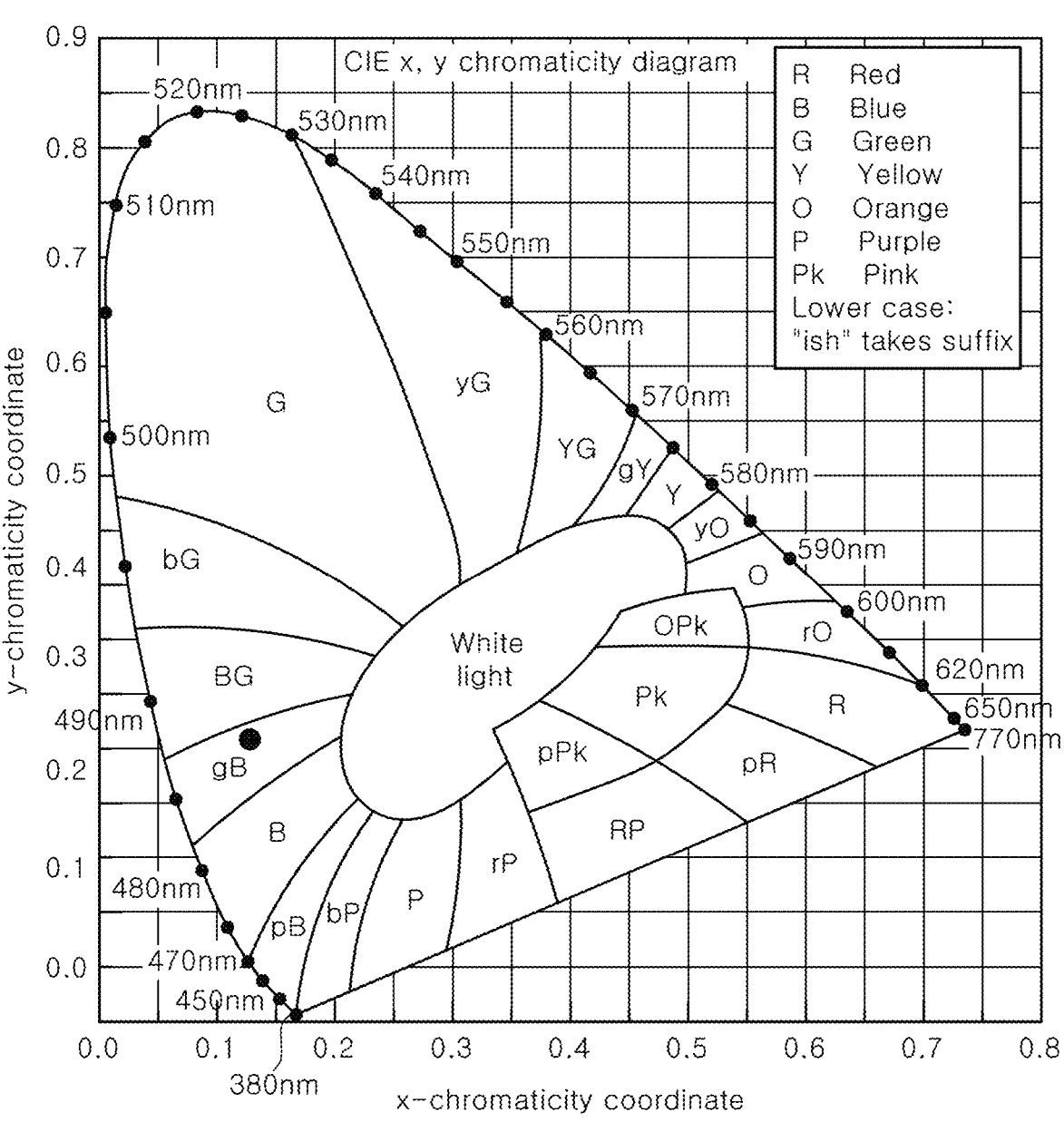
FIG. 14B is a graph in which color coordinates of another light emitting diode fabricated according to the second exemplary embodiment are marked on the CIE 1931 color space chromaticity diagram.

FIG. 14A is an electroluminescence (EL) measurement graph of another light emitting diode fabricated according to the second exemplary embodiment of the present disclosure, and FIG. 14B is a graph in which color coordinates of another light emitting diode fabricated according to the second exemplary embodiment are marked on the CIE 1931 color space chromaticity diagram.

Referring to FIG. 14A and FIG. 14B, a first peak wavelength is about 465 nm by light emitted from the upper active layer 30 and the lower active layer 60, light having a spectrum of multi-bands is emitted with a second peak wavelength of about 513.1 nm, and a cyan region of light having color coordinates corresponding to a inner region connecting a, b, c, and d of color coordinates a(0.012, 0.494), b(0.2, 0.4), c(0.2, 0.32), and d(0.04, 0.32) is implemented. An In content in the lower active layer 60 was about 16%, and an In content in the upper active layer 30 was about 22%.

Figure 15A:
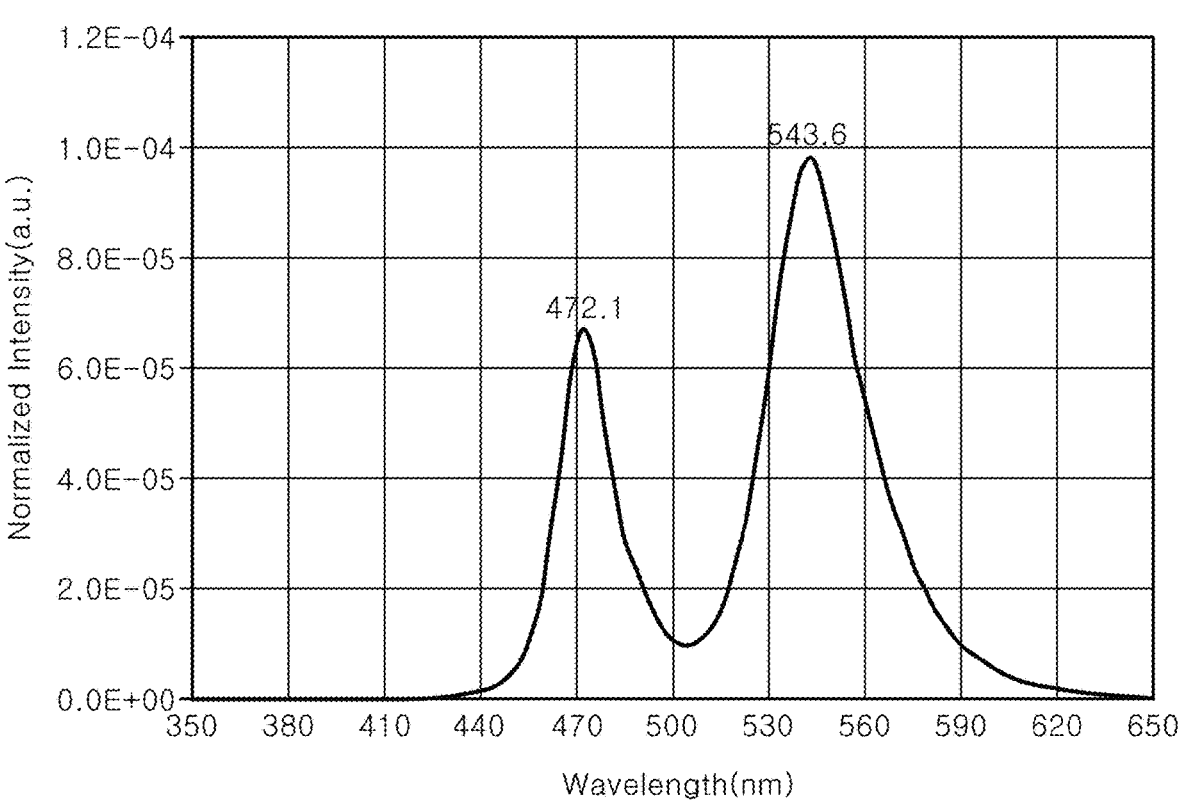
FIG. 15A is an electroluminescence (EL) measurement graph of another light emitting diode fabricated according to the second exemplary embodiment of the present disclosure.
Figure 15B:
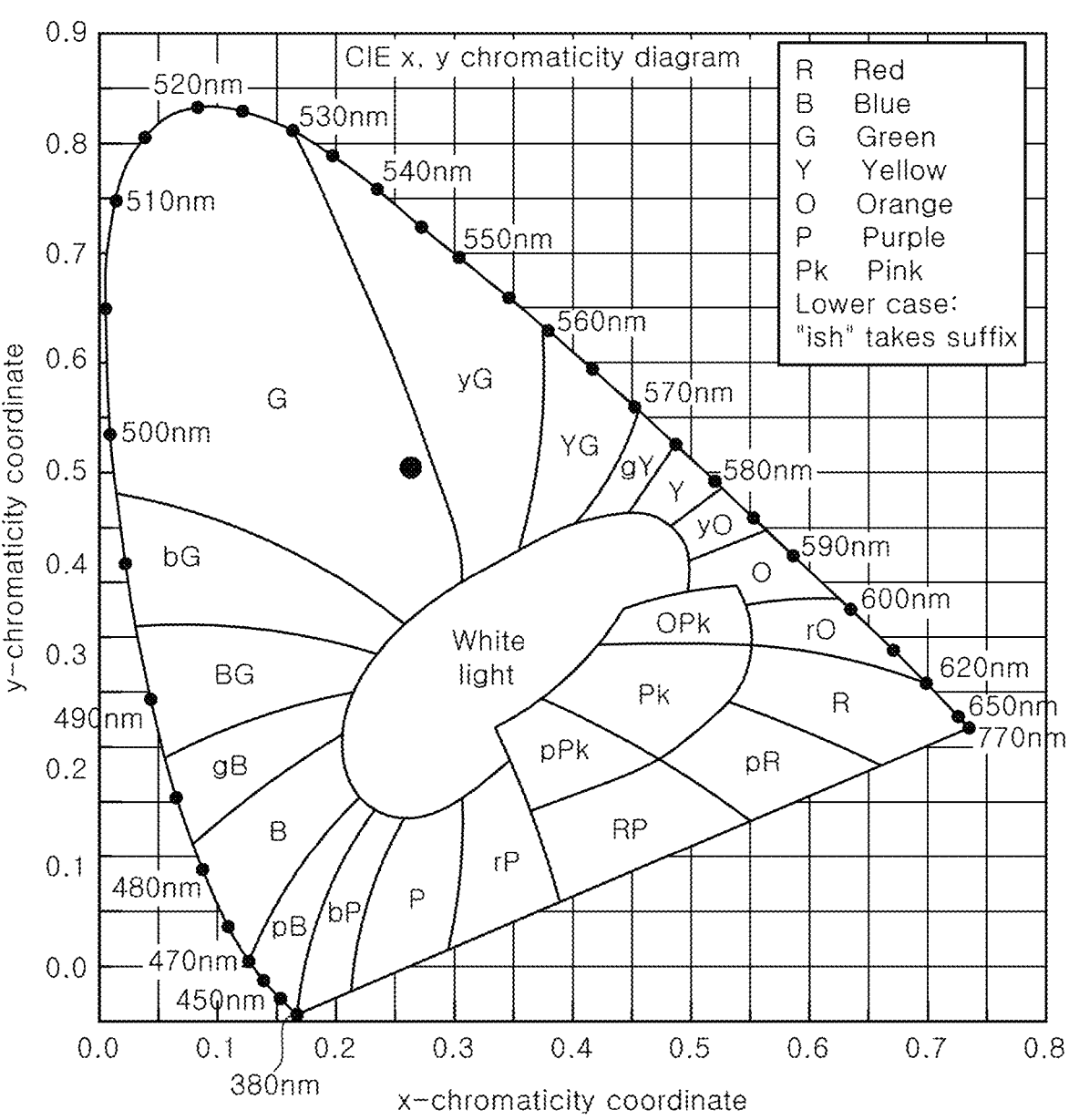
FIG. 15B is a graph in which color coordinates of another light emitting diode fabricated according to the second exemplary embodiment are marked on the CIE 1931 color space chromaticity diagram.

FIG. 15A is an electroluminescence (EL) measurement graph of another light emitting diode fabricated according to the second exemplary embodiment of the present disclosure, and FIG. 15B is a graph in which color coordinates of another light emitting diode fabricated according to the second exemplary embodiment are marked on the CIE 1931 color space chromaticity diagram.

Referring to FIG. 15A and FIG. 15B, a first peak wavelength is about 472.1 nm by light emitted from the upper active layer 30 and the lower active layer 60, light having a spectrum of multi-bands is emitted with a second peak wavelength of about 543.6 nm, and a greenish blue region of light having a color coordinate x: 0.26, y: 0.50 is implemented. An In content in the lower active layer 60 was about 17%, and an In content in the upper active layer 30 was about 24%.

Figure 16A:
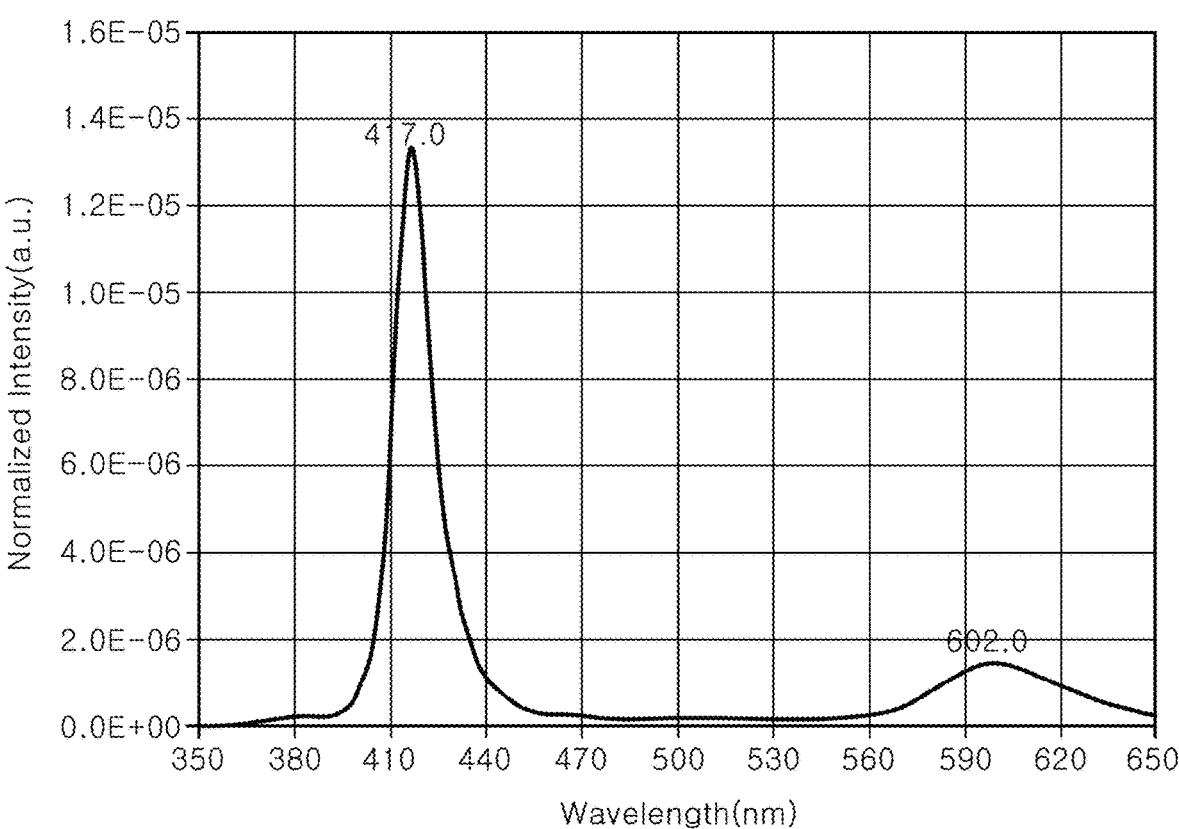
FIG. 16A is an electroluminescence (EL) measurement graph of another light emitting diode fabricated according to the second exemplary embodiment of the present disclosure.
Figure 16B:
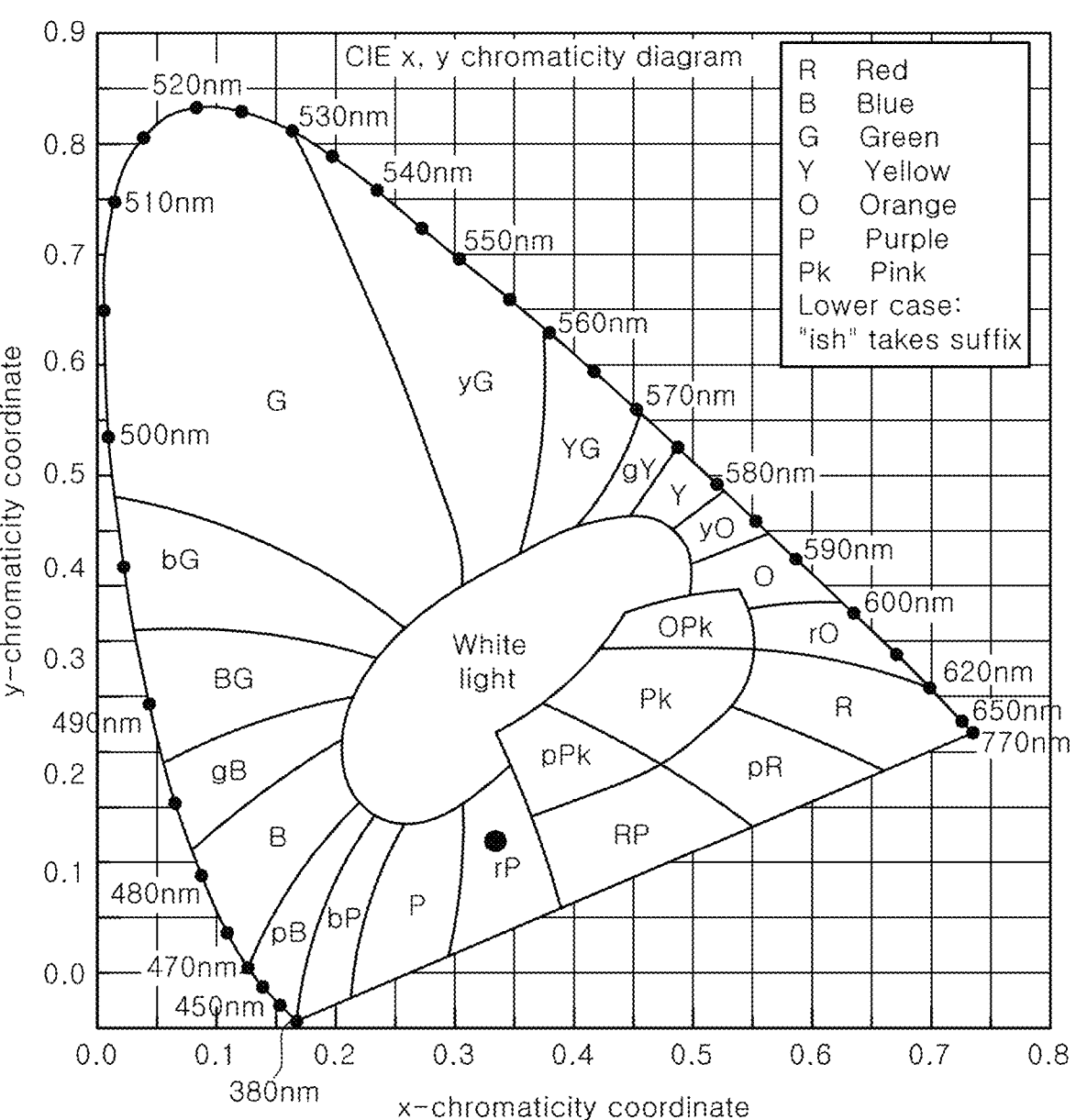
FIG. 16B is a graph in which color coordinates of another light emitting diode fabricated according to the second exemplary embodiment are marked on the CIE 1931 color space chromaticity diagram.

FIG. 16A is an electroluminescence (EL) measurement graph of another light emitting diode fabricated according to the second exemplary embodiment of the present disclosure, and FIG. 16B is a graph in which color coordinates of another light emitting diode fabricated according to the second exemplary embodiment are marked on the CIE 1931 color space chromaticity diagram.

Referring to FIG. 16A and FIG. 16B, a first peak wavelength is about 417 nm by light emitted from the upper active layer 30 and the lower active layer 60, and light having a spectrum of multi-bands is emitted with a second peak wavelength of about 602 nm, and a color coordinate x: 0.32, y: 0.17 represents a color of a purple region. In the illustrated exemplary embodiment, an InGaN well layer was used to emit light having a peak wavelength of 600 nm or more in the first well region 30-1 of the upper active layer 30. An In content in the lower active layer 60 was about 9%, and an In content in the upper active layer 30 was about 31%.

Figure 17A:
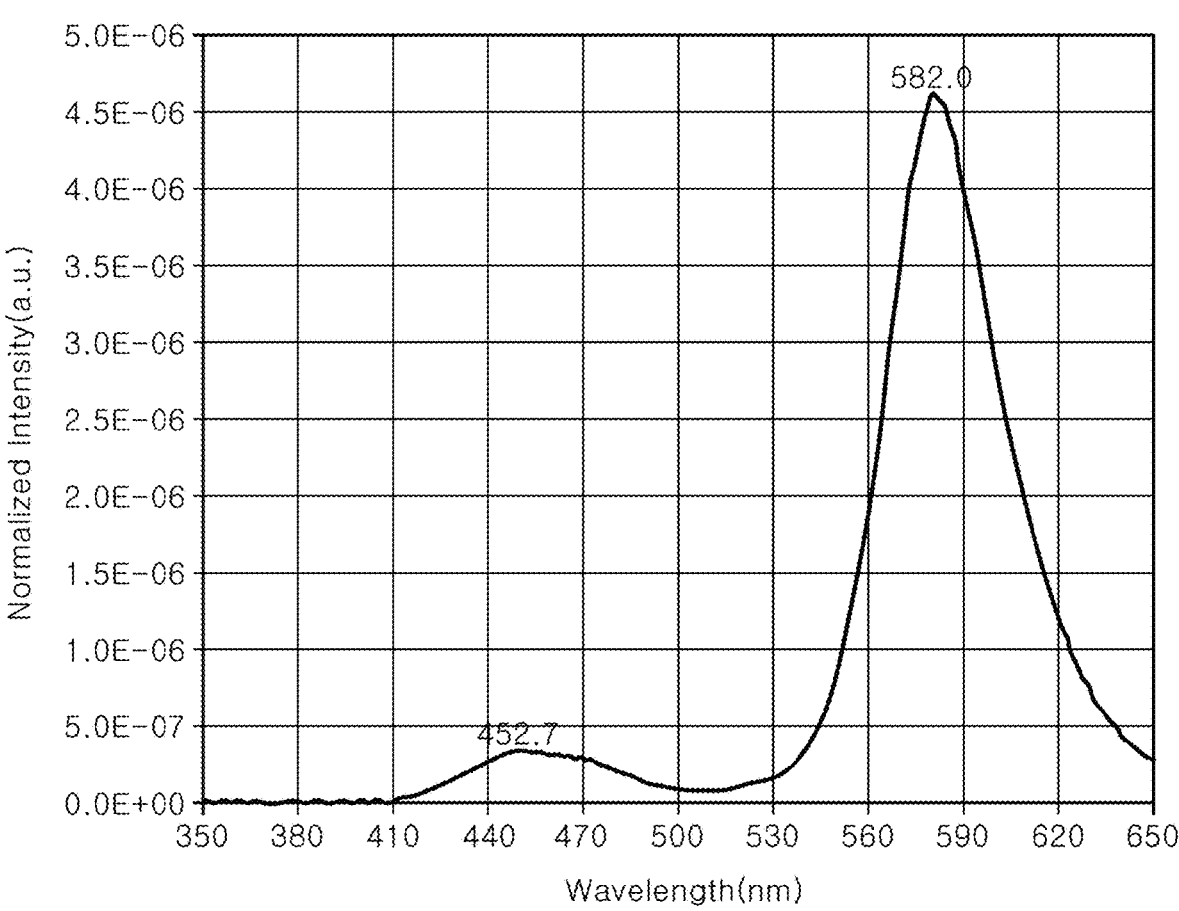
FIG. 17A is an electroluminescence (EL) measurement graph of another light emitting diode fabricated according to the second exemplary embodiment of the present disclosure.
Figure 17B:
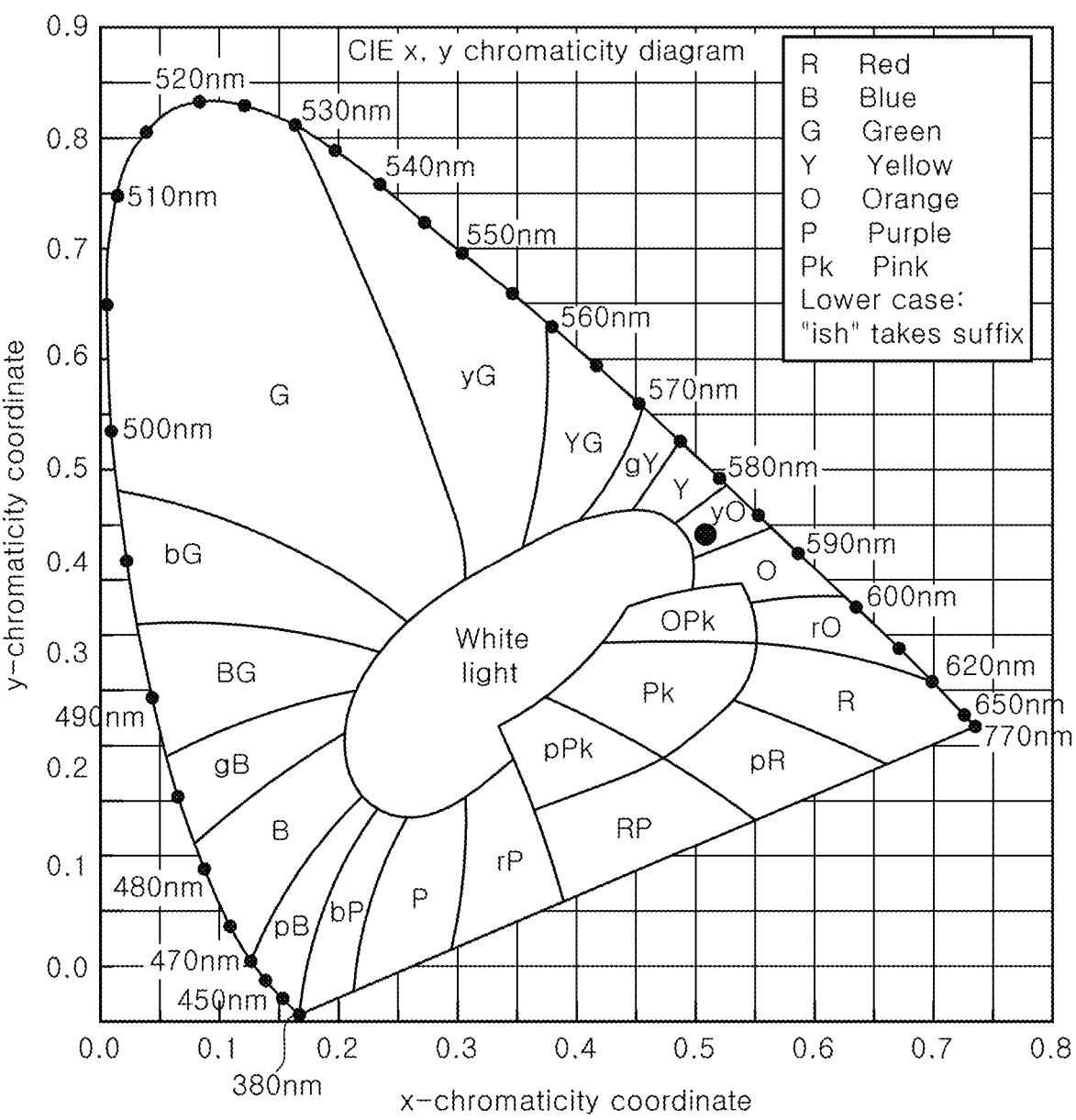
FIG. 17B is a graph in which color coordinates of another light emitting diode fabricated according to the second exemplary embodiment are marked on the CIE 1931 color space chromaticity diagram.

FIG. 17A is an electroluminescence (EL) measurement graph of another light emitting diode fabricated according to the second exemplary embodiment of the present disclosure, and FIG. 17B is a graph in which color coordinates of another light emitting diode fabricated according to the second exemplary embodiment are marked on the CIE 1931 color space chromaticity diagram.

Referring to FIG. 17A and FIG. 17B, a first peak wavelength is about 452.7 nm by light emitted from the upper active layer 30 and the lower active layer 60, and light having a spectrum of multi-bands is emitted with a second peak wavelength about 582 nm, a color coordinate x: 0.50, y: 0.43 represents a color of a yellow orange region. An In content in the upper active layer 30 was about 29%.

According to the illustrated exemplary embodiment of the present disclosure, a desired white light or other mixed-color light may be implemented with a single light emitting diode by controlling the peak wavelength of light emitted from the lower active layer 60 and the upper active layer 30. In particular, cyan light located within a region surrounded by color coordinates of four points: (0.012, 0.494), (0.2, 0.4), (0.2, 0.32), (0.04, 0.32) may be implemented by the light emitting diode without using a phosphor.

Figure 18:
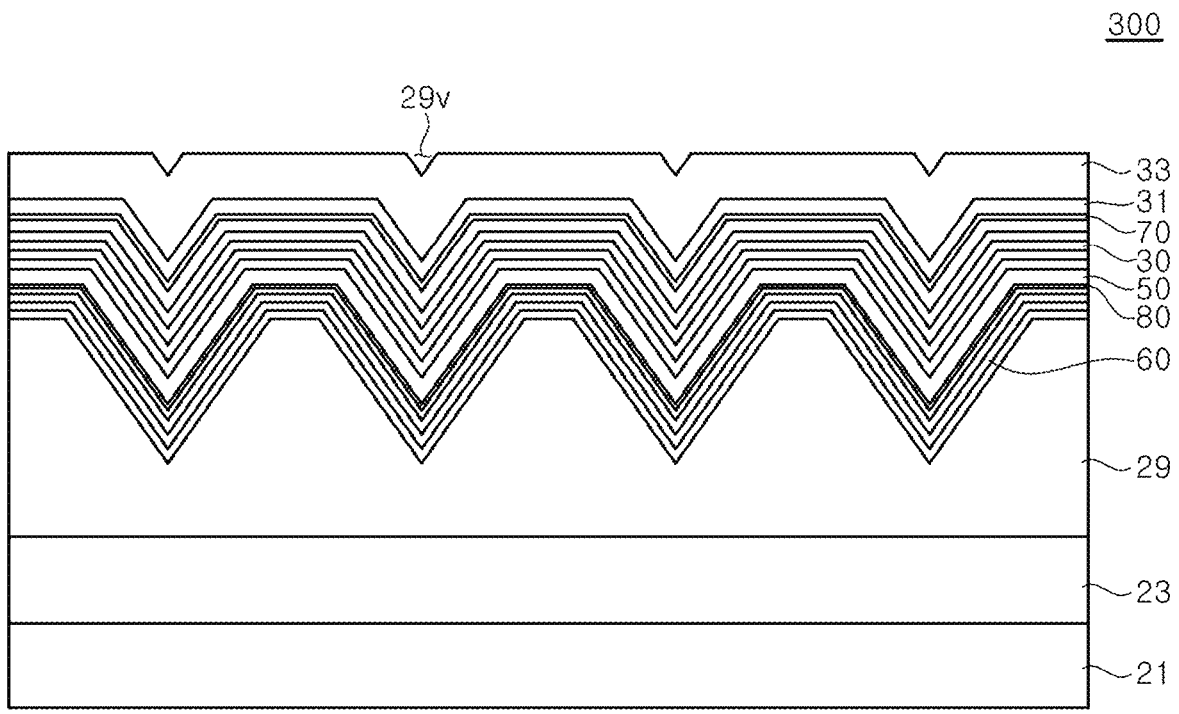
FIG. 18 is a schematic cross-sectional view illustrating a light emitting diode according to a third exemplary embodiment.

FIG. 18 is a schematic cross-sectional view illustrating a light emitting diode 300 according to a third exemplary embodiment of the present disclosure.

Referring to FIG. 18, the light emitting diode 300 according to the illustrated exemplary embodiment is substantially similar to the light emitting diode described with reference to FIG. 8 and FIG. 9, except that it further includes a lower step cover layer 80.

The lower step coverage layer 80 is disposed on the lower active layer 60, and blocks injection of holes into a second well region 60-2 of a lower active layer 60 to prevent light from being generated in the second well region 60-2. Furthermore, the lower step coverage layer 80 relieves a stress of an upper active layer 30 to improve a radiation efficiency of the light emitting diode 300.

By applying a structure of the present invention, an effective longer wavelength LED emitting light with a wavelength of 500 nm or more may be implemented. In general, to implement a device that emits longer wavelength light of 500 nm or more, a content of a wavelength-determining material that determines a wavelength of emitted light, for example, a content of a material such as In, may be important. However, since In is vulnerable to high temperatures, there is a limit to injecting an In content for emitting longer wavelength light. However, applying features of the present disclosure described above may increase the In content injected into the active layer, thereby providing a light emitting device having emission characteristics close to those of a single peak in electro luminescence.

Figure 19A:
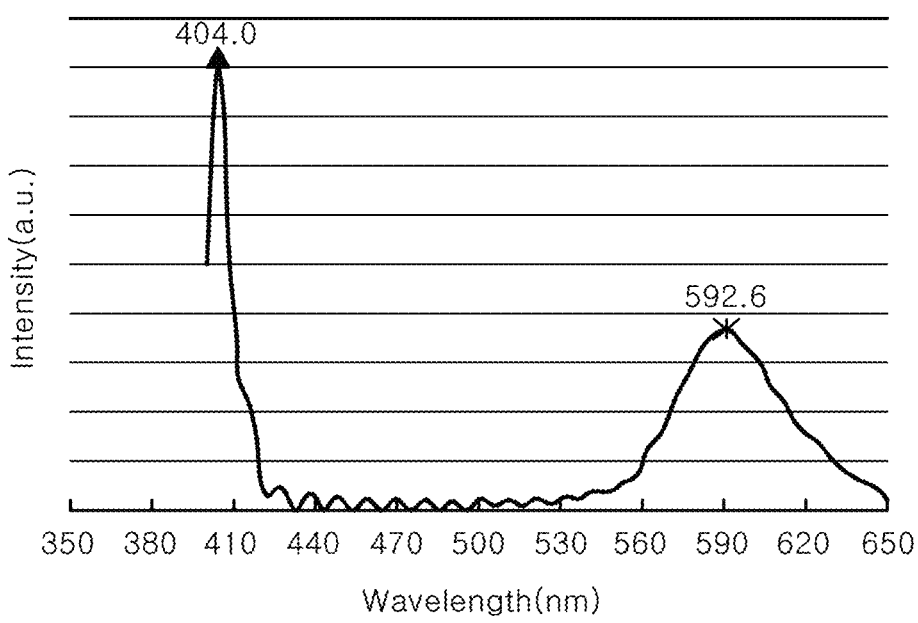
FIG. 19A and FIG. 19B are photoluminescence (PL) and electroluminescence (EL) measurement graphs of a first light emitting diode manufactured according to the third exemplary embodiment of the present disclosure, respectively.
Figure 19B:
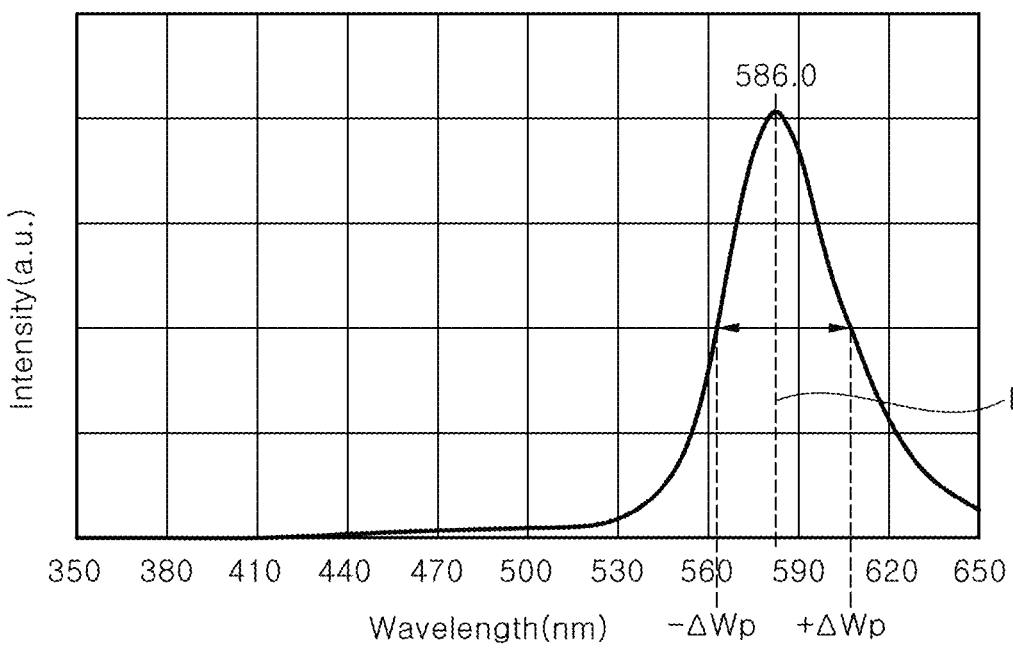
Figure 20A:
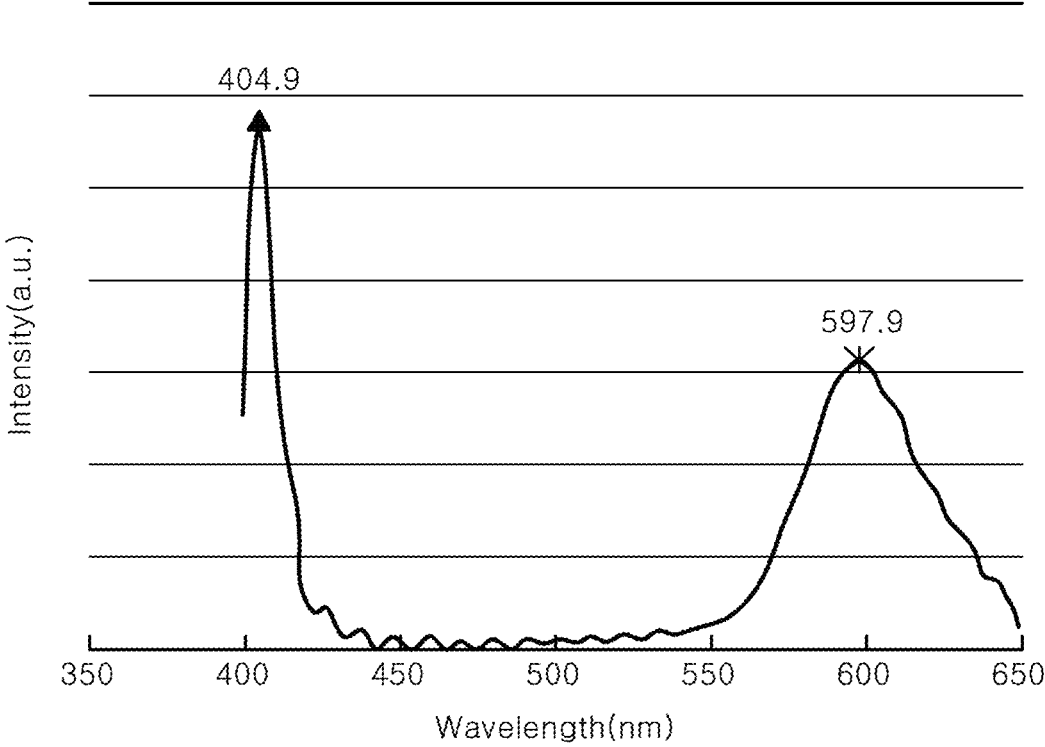
FIG. 20A and FIG. 20B are PL (photoluminescence) and electroluminescence (EL) measurement graphs of a second light emitting diode manufactured according to the third exemplary embodiment of the present disclosure, respectively.
Figure 20B:
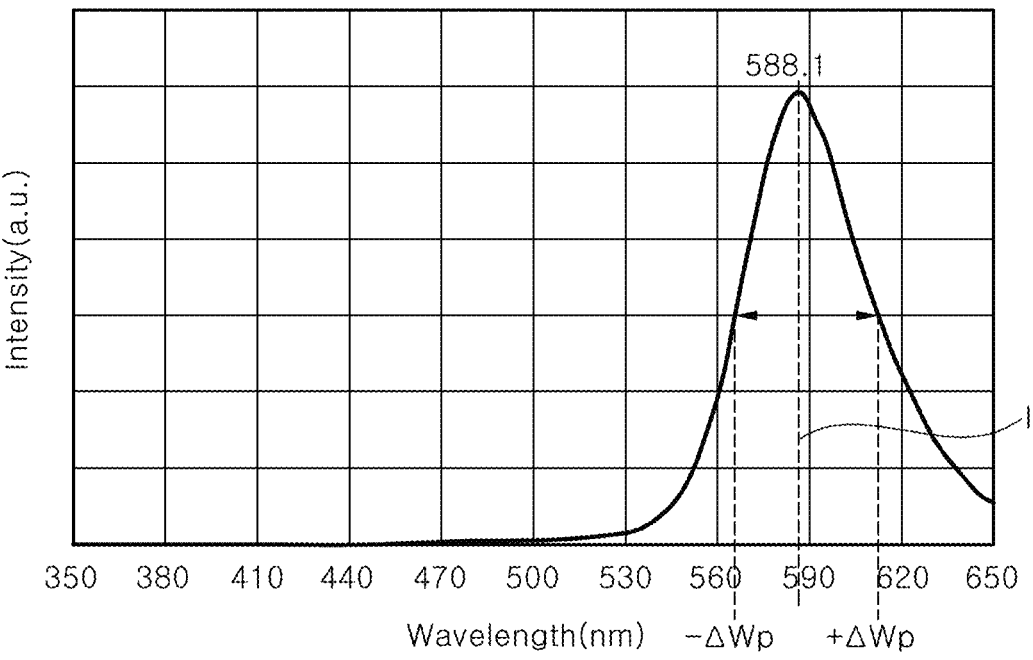
Figure 21A:
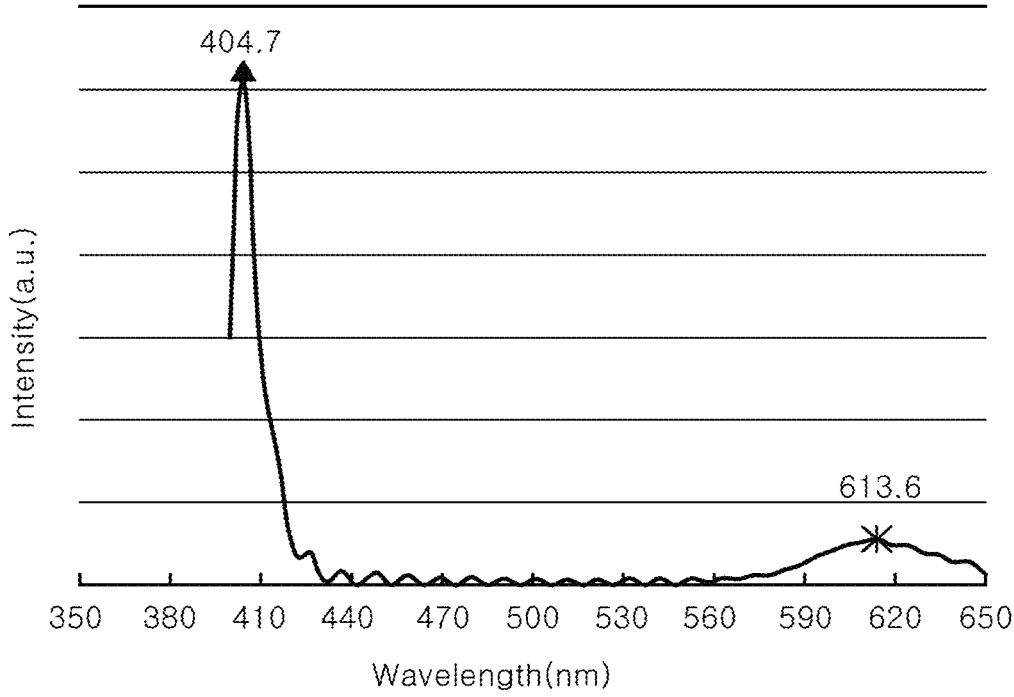
FIG. 21A and FIG. 21B are photoluminescence (PL) and electroluminescence (EL) measurement graphs of a third light emitting diode manufactured according to the third exemplary embodiment of the present disclosure, respectively.
Figure 21B:
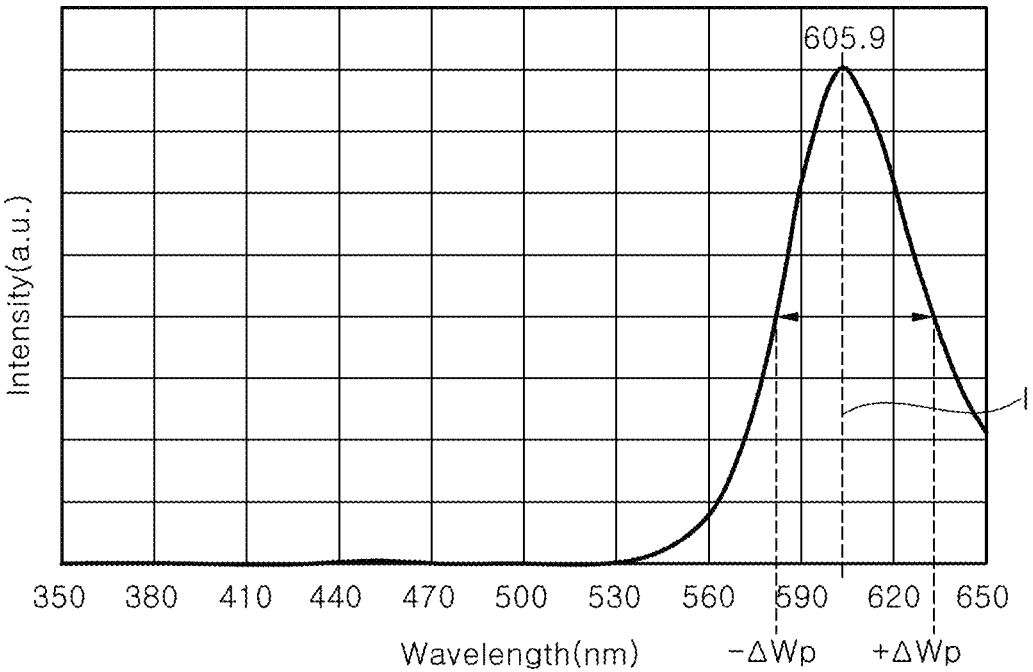
Figure 22A:
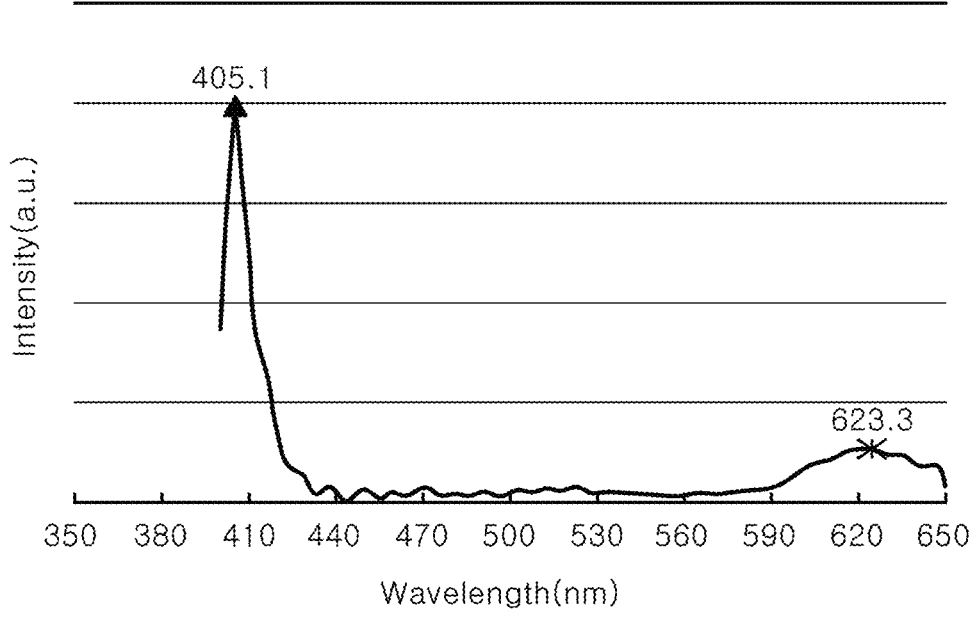
FIG. 22A and FIG. 22B are PL (Photoluminescence) and EL (Electroluminescence) measurement graphs of a fourth light emitting diode manufactured according to the third exemplary embodiment of the present disclosure, respectively.
Figure 22B:
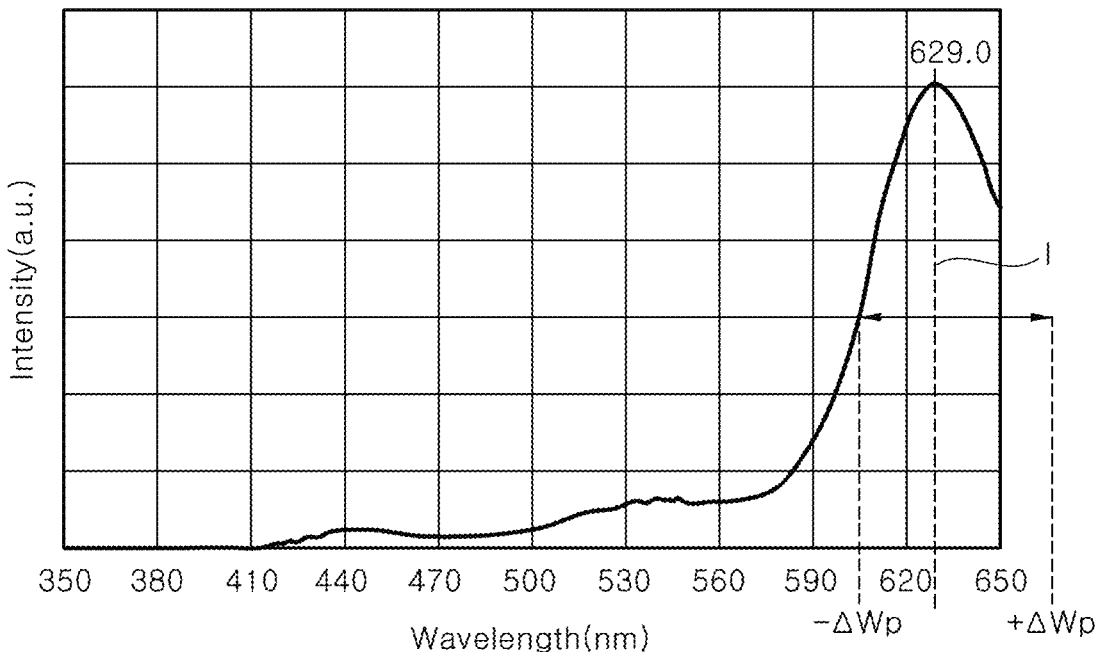

FIG. 19A and FIG. 19B are photoluminescence (PL) and electroluminescence (EL) measurement graphs of a first light emitting diode manufactured according to the third exemplary embodiment of the present disclosure, respectively, FIG. 20A and FIG. 20B are PL and (EL) measurement graphs of a second light emitting diode manufactured according to the third exemplary embodiment of the present disclosure, respectively, FIG. 21A and FIG. 21B are PL and EL measurement graphs of a third light emitting diode manufactured according to the third exemplary embodiment of the present disclosure, respectively, and FIG. 22A and FIG. 22B are PL and EL measurement graphs of a fourth light emitting diode manufactured according to the third exemplary embodiment of the present disclosure, respectively. Well layers of an upper active layer 30 of the first light emitting diode have In contents of 29 to 30%, and well layers of an upper active layer 30 of the second through fourth light emitting diodes sequentially include more In contents than that of the well layer of the upper active layer 30 of the first light emitting diode. The EL of each of the light emitting diodes was measured under a same current density condition of 35 mA/cm$^2$.

The first through fourth light emitting diodes exhibit a plurality of peaks in the PL spectrum, and in particular, a first peak is exhibited at 450 nm or less, and a second peak at 500 nm or more. In PL spectrums, intensities of the first peak may be greater than those of the second peaks. On the contrary, in EL spectrums of the first through fourth light emitting diodes, intensities of the second peaks are higher than those of the first peaks, and the intensities of the first peaks are very low or almost absent. That is, the first through fourth light emitting diodes have the EL spectrum shape different from that of the PL spectrum. Herein, a different shape means any difference in a shape of an overall spectrum, such as a difference in the number of peaks or a difference in peak heights.

In the EL measurement, the first light emitting diode emitted light of yellowish orange color of color coordinates (0.52, 046), the second light emitting diode emitted light of orange color of color coordinates (0.55, 0.44), the third light emitting diode emitted light of reddish orange color of color coordinates (0.61, 0.38), and the fourth light emitting diode emitted light of red color of color coordinates (0.59, 0.36).

The difference between the PL spectrum and the EL spectrum is considered to be caused by the following reasons. That is, when the PL is measured, since band gap energies of the upper step coverage layer 70 formed on the upper active layer 30 and the lower step coverage layer 80 formed on the lower active layer 60 are greater than band gap energies of the well layers of the upper and lower active layers 30 and 60, energies of light generated in the upper and active layers 30 and 60 are lower than the band gap energies of the upper and lower step coverage layers 70 and 80. Accordingly, light generated in the upper and active layers 30 and 60 may pass through the upper and lower step coverage layers 70 and 80 without being absorbed by them. Therefore, the plurality of peaks can be observed in the PL spectrum.

On the contrary, when the EL is measured by supplying power, since the upper and lower step coverage layers 70 and 80 serve as electrical barriers, a flow of electrons that generate shorter wavelength light of the first peak is blocked, and thus, light of the second peak is emitted more predominantly than light of the first peak.

The first through fourth light emitting diodes according to the exemplary embodiments of the present disclosure show the EL spectrum in a left-right asymmetric shape. Furthermore, when a virtual center line I is formed based on a peak wavelength having a peak value of the EL spectrum, an area of a longer wavelength region of the EL spectrum from the virtual center line I may be larger than that of a shorter wavelength region. In addition, a wavelength difference value −ΔWp from the imaginary center line I to a shorter wavelength edge of a full width at half maximum and a wavelength difference value ΔWp from the imaginary center line I to a longer wavelength edge of the full width at half maximum may be different, and further, the wavelength difference value ΔWp to the longer wavelength edge may be greater than the wavelength difference value −ΔWp to the shorter wavelength edge.

According to exemplary embodiments of the present disclosure, it is possible to implement the EL spectrum that emits longer wavelength light using InGaN, and thus, a high-efficiency longer wavelength InGaN light emitting device may be implemented. Accordingly, the InGaN light emitting device may be used as a red light emitting device instead of a conventional GaAs or GaP based red light emitting device. The red light emitting device may be used in a sub-pixel in a display apparatus along with blue and green light emitting devices. Accordingly, it is possible to implement all of RGB using only the InGaN light emitting devices without using phosphors.

Group 5 materials of the semiconductor layer constituting the RGB devices may all contain a same material (A). The material (A) may be a material having an average relative mass of 70 or less. Alternatively, types of materials, elements, or atoms constituting a well layer generating each of RGB colors may include a same material, element, or atom, and may have different band gap energies or different refractive indices. Alternatively, each of them may have different thicknesses. The material (A) may be nitrogen.

Each of the RGB devices may include light transmissive substrates made of a same material. Alternatively, they may be arranged so as to share a same light transmissive substrate.

The RGB devices may include a buffer layer including a same material between the light transmissive substrate and the well layer. A Group 3 material constituting the buffer layer may be at least one of Ga, In, and Al, and a Group 5 material may be nitrogen. However, the buffer layer is not absolutely necessary, and can be removed.

The RGB devices may include a first nitride semiconductor layer including a same material between the light transmissive substrate and the well layer. A Group 3 material constituting the first nitride semiconductor layer may be at least one of Ga, In, and Al, and a Group 5 material may be nitrogen. In addition, the first nitride semiconductor layer of each of the RGB devices may include a same dopant material. The dopant material may be Si.

The RGB devices may include a second nitride semiconductor layer including a same material over the well layer. A Group 3 material constituting the second nitride semiconductor layer may be at least one of Ga, In, and Al, and a Group 5 material may be nitrogen. In addition, the second nitride semiconductor layer of each of RGB devices may include a same dopant material. The dopant material may be Mg.

Each of the RGB devices may individually include at least one V pit, and the V pits included in the RGB devices may have different depths from one another. Alternatively, the V pits included in the RGB devices may have different widths from one another. Alternatively, side surfaces of V pits included in the RGB devices may have different slopes from one another.

Figure 23A:
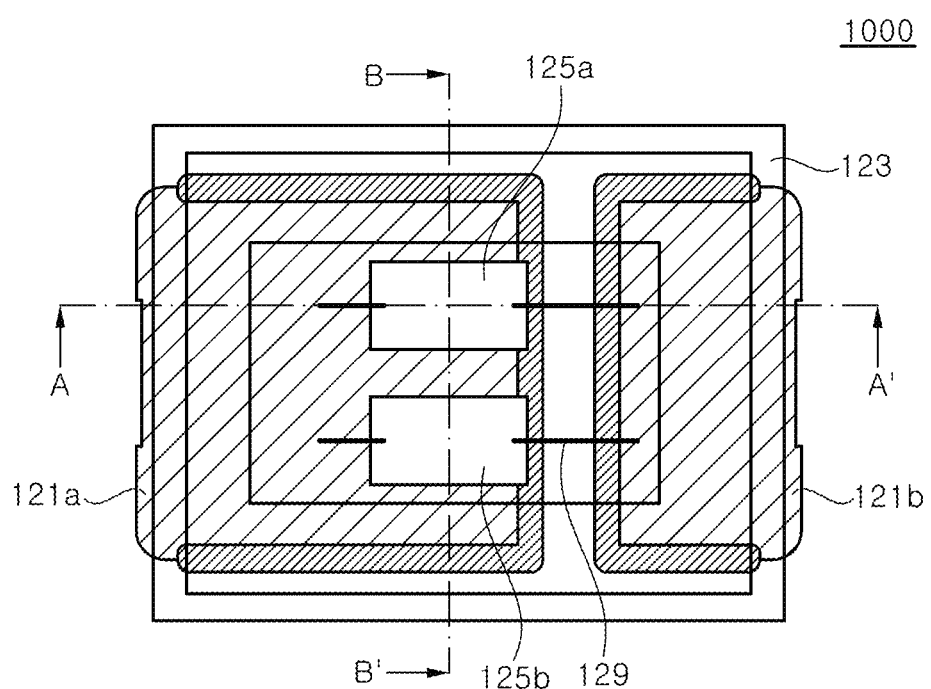
FIG. 23A is a schematic plan view illustrating a light emitting device according to an exemplary embodiment of the present disclosure.
Figure 23B:
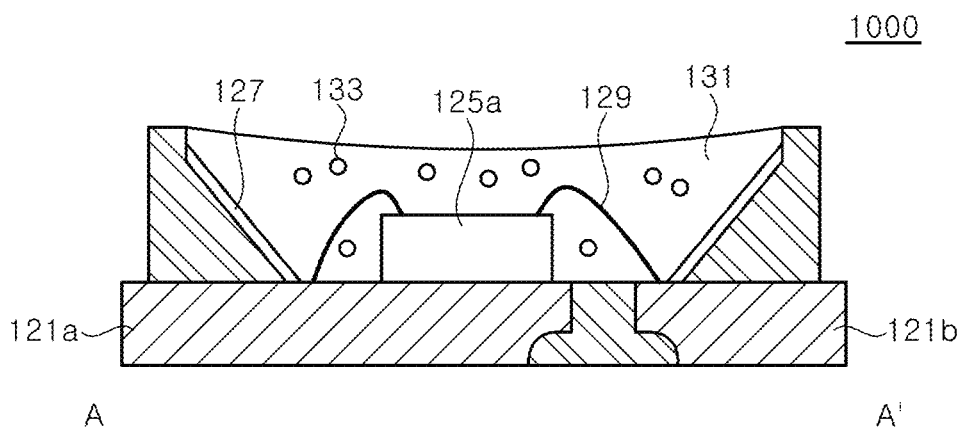
FIG. 23B is a schematic cross-sectional view taken along line A-A' of its corresponding view shown in FIG. 23A.
Figure 23C:
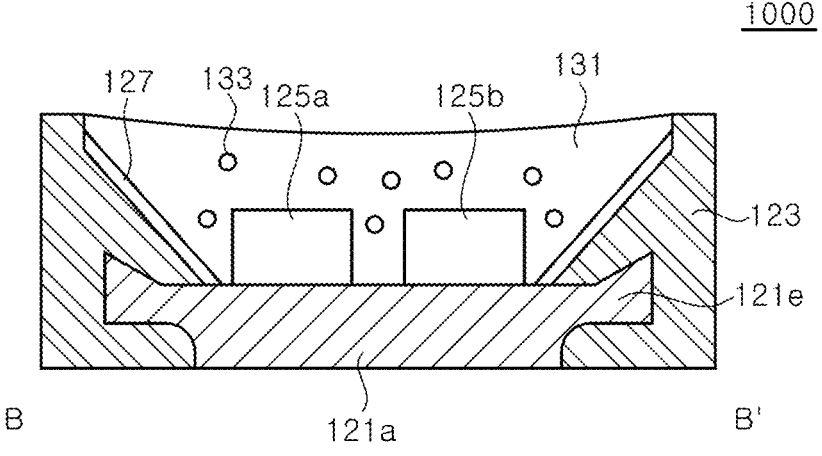
FIG. 23C is a schematic cross-sectional view taken along line B-B' of its corresponding view shown in FIG. 23A.

FIG. 23A is a schematic plan view illustrating a light emitting device 1000 according to an exemplary embodiment of the present disclosure, FIG. 23B is a schematic cross-sectional view taken along line A-A' of its corresponding view shown in FIG. 23A, and FIG. 23C is a schematic cross-sectional view taken along line B-B' of its corresponding view shown in FIG. 23A.

Referring to FIG. 23A, FIG. 23B, and FIG. 23C, the light emitting device 1000 may include a first lead 121*a*, a second lead 121*b*, a housing 123, light emitting diode chips 125*a* and 125*b*, and a reflector 127, bonding wires 129, and a molding member 131.

The first lead 121*a* and the second lead 121*b* may be formed of a conductive material, for example, a metal. Bottom surfaces of the first lead 121*a* and the second lead 121*b* may be partially removed by half-cutting, and thus, may include relatively thin regions. In addition, the first lead 121*a* and the second lead 121*b* may include anchors 121*e* protruding upward from upper surfaces of the leads 121*a* and 121*b* as shown in FIG. 23C. The anchors 121*e* may be formed on edges of the leads 121*a* and 121*b*, and in particular, may be disposed over half-cut regions. The anchors 121*e* prevent the leads 121*a* and 121*b* from being separated from the housing 123. The anchors 121*e* may include a region where a thickness thereof changes in cross-section view. In addition, upper surfaces and lower surfaces of the anchors 121*e* may not be parallel, and may be asymmetrical shapes. A portion of the anchors 121*e* protruding above the upper surface has an angle, and a protruding angle may be less than or equal to 60 degrees with respect to a mounting surface of the light emitting diode chip. Due to this shape, bonding with the housing 123 may be further enhanced.

The housing 123 covers side surfaces of the leads 121*a* and 121*b* and partially covers upper surfaces thereof. The housing 123 forms a cavity over the leads 121*a* and 121*b*. The housing 123 may be formed of, for example, an epoxy molding compound (EMC).

The light emitting diode chips 125*a* and 125*b* may be disposed on the first lead 121*a*, and may be electrically connected to the first and second leads 121*a* and 121*b* through the bonding wires 129. The light emitting diode chips 125a and 125b may include the light emitting diodes 100, 200, and 300 described in the previous embodiments. The light emitting diode chips 125a and 125b may emit light of a same color, without being limited thereto, and may emit light of different colors.

The reflector 127 may be formed on an inner wall of the housing 123. The reflector 127 may be formed of a material having a higher reflectance than that of the housing 123, and may include, for example, white silicone.

The molding member 131 covers the light emitting diode chips 125a and 125b. The molding member 131 may fill the cavity of the housing 123. The molding member 131 may be formed of transparent silicone. In an exemplary embodiment, the molding member 131 may not include a phosphor. Since the light emitting diode chips 125a and 125b emit mixed-color light, a desired mixed-color light may be implemented without using a phosphor 133. In another exemplary embodiment, the molding member 131 may include the phosphor 133. Since the light emitting diode chips 125a and 125b emit mixed-color light, an amount of the phosphor 133 used may be relatively less than that of a conventional light emitting device.

Figure 24:
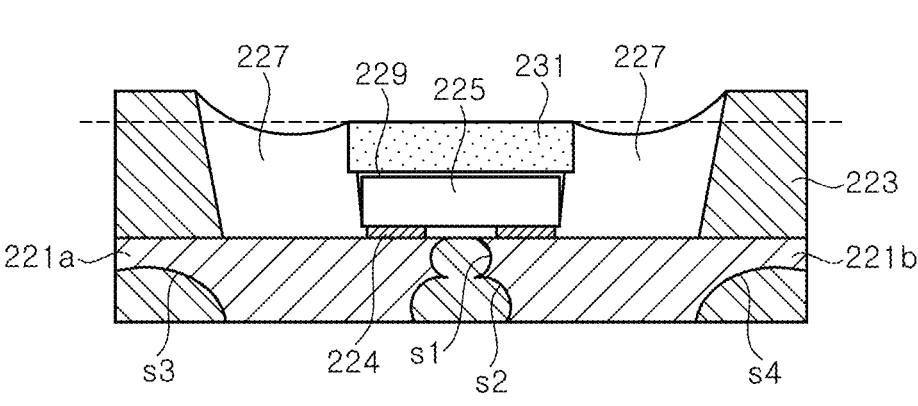
FIG. 24 is a schematic cross-sectional view illustrating a light emitting device according to another exemplary embodiment.

FIG. 24 is a schematic cross-sectional view illustrating a light emitting device 2000 according to another exemplary embodiment of the present disclosure.

Referring to FIG. 24, the light emitting device 2000 may include a first lead 221a, a second lead 221b, a housing 223, light emitting diode chips 225, a reflector 227, an adhesive 229, and a wavelength converter 231.

The first lead 221a and the second lead 221b may be formed of a conductive material, for example, a metal. Bottom surfaces of the first lead 221a and the second lead 221b may be partially removed by half-cutting, and thus, may include relatively thin regions. In addition, the first lead 221a and the second lead 221b may be separated from each other by etching. Furthermore, although not shown in the drawing, a through-hole may be formed in each of the first lead 221a and the second lead 221b. The through-hole may be connected to the region in which the bottom surface is partially removed. The through-holes are filled with the housing 223, thereby preventing the leads 221a and 221b from being separated from the housing 223. The through-hole is selectively applicable.

The leads 221a and 221b have surfaces facing each other. The surfaces of the leads 221a and 221b facing each other may be symmetrical. The surface of each of the leads 221a and 221b facing each other may include a first surface s1 and a second surface s2. The first surface s1 may include a region having a first radius of curvature, and the second surface s2 may include a region having a second radius of curvature. The first radius of curvature may have a value different from that of the second radius of curvature. As shown in FIG. 20, the first radius of curvature of the first surface s1 may be smaller than the second radius of curvature of the second surface s2.

Meanwhile, the first and second leads 221a and 221b may include curved surfaces, that is, a third surface s3, and a fourth surface s4, along with vertical surfaces on opposite side surfaces of each other. The opposite side surfaces may be symmetrical, but the inventive concepts are not limited thereto. The third and fourth surfaces s3 and s4 may include a region having different radii of curvature from those of the first and second surfaces s1 and s2. For example, the third surface s3 and the fourth surface s4 may include a region having the radius of curvature greater than those of the first surface s1 and the second surface s2.

Since the side surfaces of the leads 221a and 221b include the regions having different radii of curvature, a coupling force between the leads 221a and 221b and the housing 223 may be enhanced.

The housing 223 covers portions of upper surfaces of the leads 221a and 221b and portions of lower surfaces of the leads 221a and 221b. In particular, the housing 223 may fill the region in which the bottom surface is partially removed by half-cutting, and may fill the through-holes formed in the leads 221a and 221b.

The housing 223 forms a cavity over the leads 221a and 221b. The housing 223 may be formed of, for example, an epoxy molding compound (EMC).

The light emitting diode chip 225 may be flip-bonded on the first lead 221a and the second lead 221b to be electrically connected. The light emitting diode chip 225 may include the light emitting diodes 100, 200, and 300 described in the previous embodiments.

The wavelength converter 231 is disposed over the light emitting diode chip 225. The wavelength converter 231 may be adhered to the light emitting diode chip 225 through the adhesive 229. The adhesive 229 may at least partially cover an upper surface as well as a side surface of the light emitting diode chip 225. A thickness of the adhesive 229 covering the side surface of the light emitting diode chip 225 may be decreased toward a lower surface of the light emitting diode chip 225.

The wavelength converter 231 may include a phosphor. Since the light emitting diode chip 225 emits mixed-color light, an amount of phosphor used may be relatively less than that of a conventional light emitting device. By using the phosphor together with the light emitting diode chip 225 emitting mixed light, mixed light having a desired color coordinate may be easily implemented.

The reflector 227 may be formed between an inner wall of the housing 223 and the wavelength converter 231. The reflector 227 may be in contact with a side surface of the wavelength converter 231 and may be in contact with an inner wall of the molding member 223. The reflector 227 may also surround the side surfaces of the light emitting diode chip 225. The adhesive 229 may be disposed between the reflector 227 and the light emitting diode chip 225.

The reflector 227 may be formed of a material having a higher reflectance than that of the housing 223, and the reflector 227 may include regions having different heights in cross-section view. For example, it may include white silicone. The reflector 227 may include a concave upper surface. A lowest height of the concave portion may be lower than an upper surface (indicated by a dotted line) of the wavelength converter 231, and an uppermost end of the reflector 227 may be disposed higher than the upper surface of the wavelength converter 231. Accordingly, light emitted from the wavelength converter 231 in a lateral direction may be reflected on the concave upper surface of the reflector 227, and thus, light may be collected in an upper direction of the light emitting diode chip 225.

The light emitting devices 1000 and 2000 according to the illustrated exemplary embodiment may easily implement mixed-color light having the desired color coordinate by using the phosphor together with the light emitting diode chips 125a, 125b, and 225 emitting mixed-color light. In particular, cyan light located within a region surrounded by color coordinates of four points: (0.012, 0.494), (0.2, 0.4), (0.2, 0.32), (0.04, 0.32) may be implemented on the CIE 1931 color space chromaticity diagram.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

What is claimed is:

1. A light emitting diode, comprising:
a first conductivity type nitride semiconductor layer;
a V-pit generation layer disposed on the first conductivity type nitride semiconductor layer and having a V-pit;
a lower active layer disposed on the V-pit generation layer;
an upper active layer disposed on the lower active layer;
an intermediate layer disposed between the lower active layer and the upper active layer;
a second conductivity type nitride semiconductor layer disposed on the upper active layer,
an upper step coverage layer disposed between the second conductivity type semiconductor layer and the upper active layer; and
a lower step coverage layer disposed between the intermediate layer and the lower active layer,
wherein in an electroluminescence spectrum, the light emitting diode emits light having a highest peak intensity in a wavelength range of 500 nm or more in a visible light region, and
wherein the lower step coverage layer has a wider band gap than that of the intermediate layer.

2. The light emitting diode of claim 1, wherein the intermediate layer includes a semiconductor layer having a composition formula of $In_xAl_yGa_{1-x-y}N$ ($0 \leq x \leq 1$, $0 \leq y \leq 1$, $0 \leq x$ $y < 1$).

3. The light emitting diode of claim 1, wherein the upper and lower step coverage layers include a nitride semiconductor layer including Al.

4. The light emitting diode of claim 1, wherein light having the highest peak intensity has a wavelength of 600 nm or more.

5. The light emitting diode of claim 1, wherein the light emitting diode emits light of a single peak in the visible light region.

6. The light emitting diode of claim 1, wherein a spectrum of light of the peak is left and right asymmetric.

7. The light emitting diode of claim 6, wherein when a virtual center line I is formed based on a peak wavelength having the peak value, an area of a longer wavelength region of the EL spectrum from the virtual center line I is larger than that of a shorter wavelength region.

8. The light emitting diode of claim 6, wherein in a spectrum of light of the peak, a wavelength difference value from the peak wavelength to a shorter wavelength edge of a full width at half maximum is smaller than a wavelength difference value from the peak wavelength to a longer wavelength edge of the full width at half maximum.

9. The light emitting diode of claim 1, wherein the emitting diode emits red light.

10. The light emitting diode of claim 1, wherein the upper step coverage layer has a wider band gap than that of a barrier layer of the upper active layer.

11. The light emitting diode of claim 1, wherein
the upper active layer includes a first well region disposed over the flat surface of the V-pit generation layer and a second well region formed along the inclined surface of the V-pit, a well layer of the first well region includes more In content than that of a well layer of the second well region, and
the second well region does not emit light.

12. The light emitting diode of claim 1, wherein the lower step coverage layer includes a region disposed over the flat surface of the V-pit generation layer and an inclined region formed on the inclined surface of the V-pit along the V-pit.

13. The light emitting diode of claim 1, wherein
the lower active layer includes a first well region disposed over the flat surface of the V-pit generation layer and a second well region formed along the inclined surface of the V-pit, a well layer of the first well region includes more In content than that of a well layer of the second well region, and
the second well region does not emit light.

14. The light emitting diode of claim 1,
wherein the light emitting diode emits light of a single peak in the visible light region.

15. A light emitting device, comprising:
a first lead and a second lead;
a housing covering the first lead and the second lead and defining a cavity; and
a light emitting diode disposed in the cavity of the housing and electrically connected to the first and second leads;
the light emitting diode, comprising:
a first conductivity type nitride semiconductor layer;
a V-pit generation layer disposed on the n-type nitride semiconductor layer and having a V-pit;
a lower active layer disposed on the V-pit generation layer;
an upper active layer disposed on the lower active layer;
an intermediate layer disposed between the lower active layer and the upper active layer;
a second conductivity type nitride semiconductor layer disposed on the upper active layer;
an upper step coverage layer disposed between the second conductivity type semiconductor layer and the upper active layer; and
a lower step coverage layer disposed between the intermediate layer and the lower active layer,
wherein in the electroluminescence spectrum, the light emitting diode emits light having a highest peak intensity in a wavelength range of 500 nm or more in a visible light region in an electroluminescence spectrum, and
wherein the lower step coverage layer has a wider band gap than that of the intermediate layer.

16. The light emitting device of claim 15, wherein the upper and lower step coverage layers include a nitride semiconductor layer containing Al.

17. The light emitting device of claim 15, wherein light having the highest peak intensity has a wavelength of 600 nm or more.

18. The light emitting device of claim 15, wherein a spectrum of light of the peak is left and right asymmetric.

19. The light emitting device of claim 15, further comprising: a reflector disposed on an inner wall of the housing, wherein the reflector includes white silicone.

* * * * *